(12) United States Patent
Yang et al.

(10) Patent No.: US 12,501,701 B2
(45) Date of Patent: Dec. 16, 2025

(54) POWER RAILS FOR STACKED SEMICONDUCTOR DEVICE

(71) Applicant: Taiwan Semiconductor Manufacturing Co., Ltd., Hsinchu (TW)

(72) Inventors: Chansyun David Yang, Shinchu (TW); Keh-Jeng Chang, Hsinchu (TW); Chan-Lon Yang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/447,948

(22) Filed: Aug. 10, 2023

(65) Prior Publication Data

US 2023/0395437 A1 Dec. 7, 2023

Related U.S. Application Data

(60) Division of application No. 17/663,608, filed on May 16, 2022, now Pat. No. 11,854,910, which is a
(Continued)

(51) Int. Cl.
*H10D 86/01* (2025.01)
*H01L 21/762* (2006.01)
(Continued)

(52) U.S. Cl.
CPC ..... *H10D 86/011* (2025.01); *H01L 21/76256* (2013.01); *H01L 21/76816* (2013.01); *H01L 21/76898* (2013.01); *H01L 23/5226* (2013.01); *H01L 23/5286* (2013.01); *H10D 86/215* (2025.01)

(58) Field of Classification Search
CPC ............... H10D 86/011; H10D 86/215; H10D 30/6735; H10D 30/6757; H10D 84/0186; H10D 84/85; H10D 84/0149; H10D 84/0193; H10D 84/038; H10D 84/83; H10D 84/853; H01L 21/76256; H01L 21/76816;
(Continued)

(56) References Cited

U.S. PATENT DOCUMENTS 9,093,530 B2 7/2015 Huang et al.
9,105,490 B2 8/2015 Wang et al.
(Continued)

*Primary Examiner* — Dao H Nguyen
(74) *Attorney, Agent, or Firm* — Sterne, Kessler, Goldstein & Fox P.L.L.C.

(57) ABSTRACT

The present disclosure describes a method to form a stacked semiconductor device with power rails. The method includes forming the stacked semiconductor device on a first surface of a substrate. The stacked semiconductor device includes a first fin structure, an isolation structure on the first fin structure, and a second fin structure above the first fin structure and in contact with the isolation structure. The first fin structure includes a first source/drain (S/D) region, and the second fin structure includes a second S/D region. The method also includes etching a second surface of the substrate and a portion of the first S/D region or the second S/D region to form an opening. The second surface is opposite to the first surface. The method further includes forming a dielectric barrier in the opening and forming an S/D contact in the opening.

20 Claims, 12 Drawing Sheets

Related U.S. Application Data continuation of application No. 16/997,062, filed on Aug. 19, 2020, now Pat. No. 11,335,606.

(51) Int. Cl.
  *H01L 21/768* (2006.01)
  *H01L 23/522* (2006.01)
  *H01L 23/528* (2006.01)
  *H10D 86/00* (2025.01)

(58) Field of Classification Search
  CPC ......... H01L 21/76898; H01L 21/76224; H01L 23/5226; H01L 23/5286; H01L 23/485
  See application file for complete search history.

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,303 B2 | 1/2017 | Lee et al. |
| 9,548,366 B1 | 1/2017 | Ho et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,831,183 B2 | 11/2017 | Lin et al. |
| 9,859,386 B2 | 1/2018 | Ho et al. |
| 11,335,606 B2 * | 5/2022 | Yang .................... H01L 23/5286 |
| 2008/0054313 A1 | 3/2008 | Dyer et al. |
| 2018/0061766 A1 | 3/2018 | Goktepeli |
| 2018/0175034 A1 * | 6/2018 | Goktepeli ....... H01L 21/823878 |
| 2019/0131395 A1 | 5/2019 | Lee et al. |
| 2019/0198627 A1 | 6/2019 | Then et al. |
| 2019/0326175 A1 | 10/2019 | Lilak et al. |
| 2020/0105751 A1 | 4/2020 | Dewey et al. |
| 2020/0294998 A1 * | 9/2020 | Lilak .................... H01L 23/481 |
| 2020/0303509 A1 | 9/2020 | Mehandru et al. |
| 2020/0328210 A1 | 10/2020 | Wu et al. |
| 2021/0098294 A1 * | 4/2021 | Smith .................. H01L 23/535 |
| 2021/0343578 A1 | 11/2021 | Chang et al. |
| 2021/0376094 A1 * | 12/2021 | Lin .................. H01L 29/42392 |
| 2022/0270935 A1 | 8/2022 | Yang et al. |

* cited by examiner

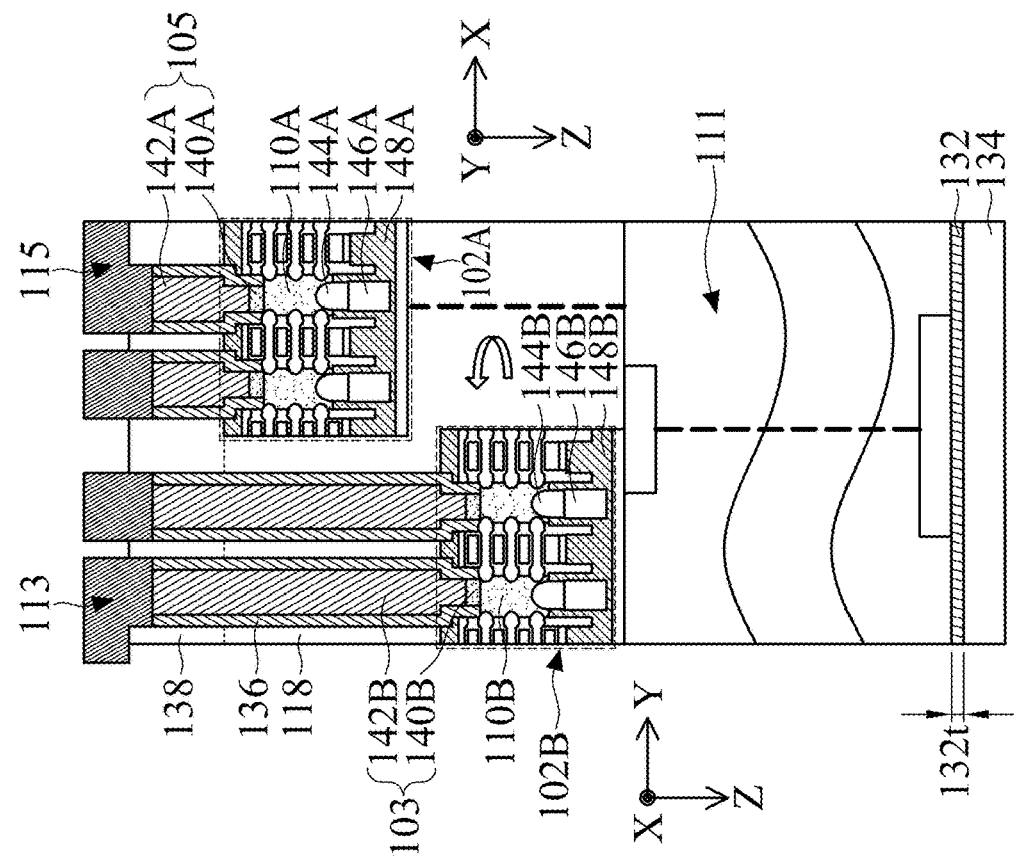
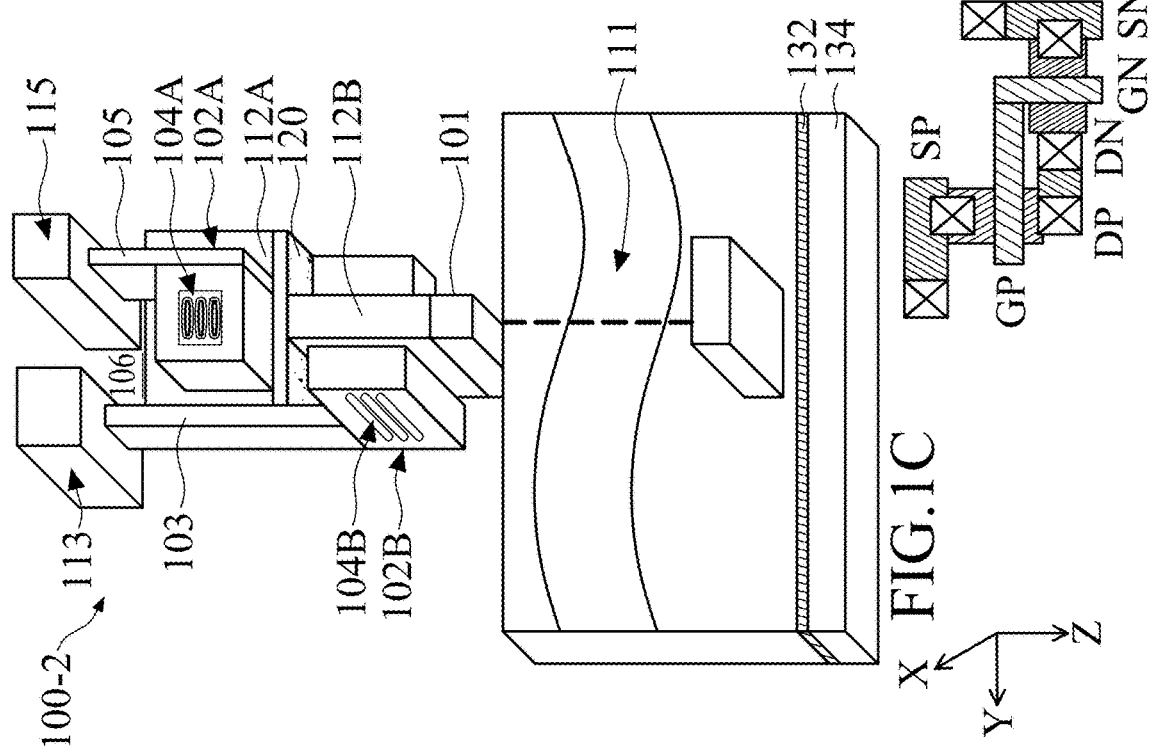
FIG. 1D
FIG. 1C
FIG. 1E

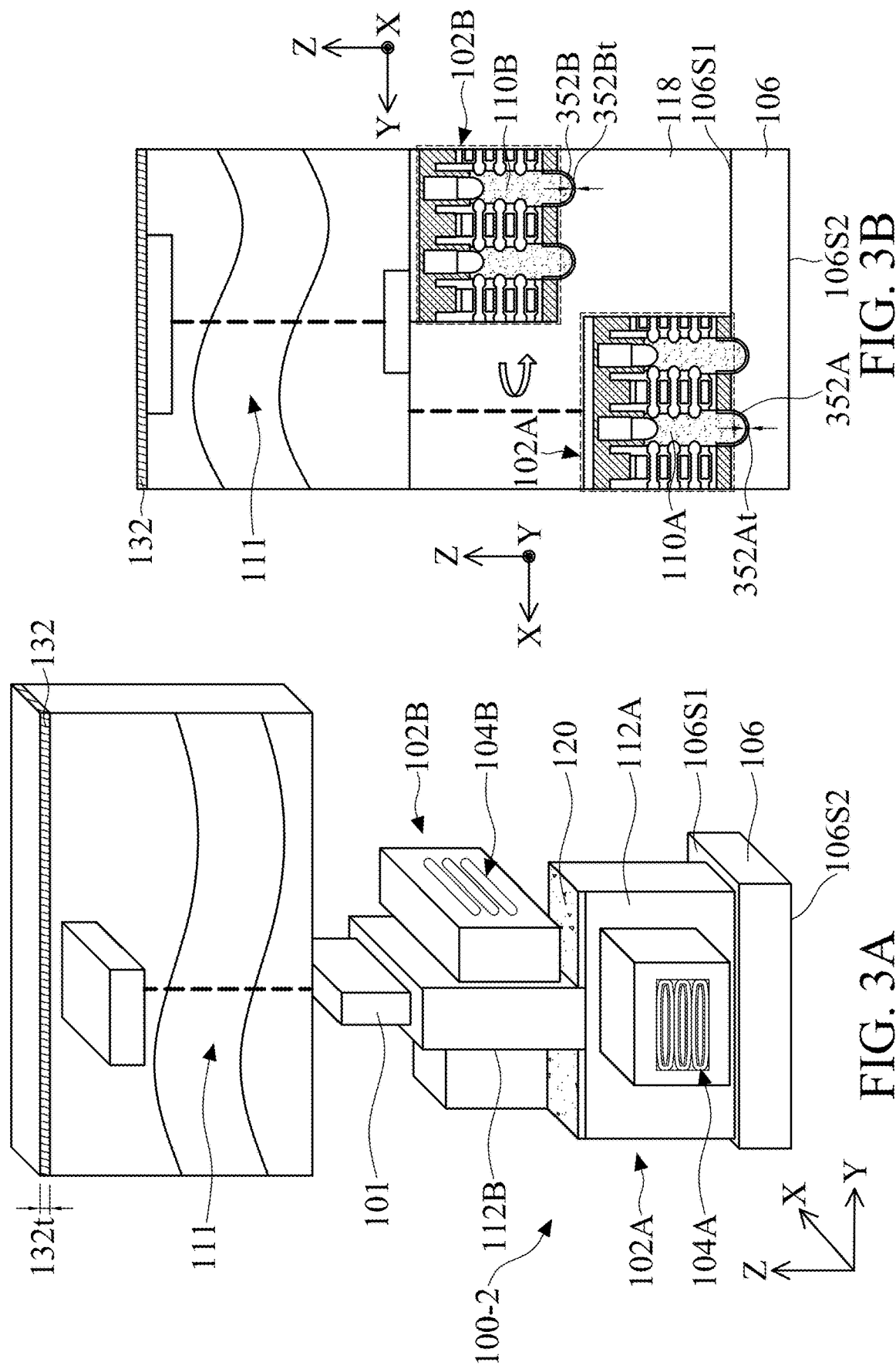

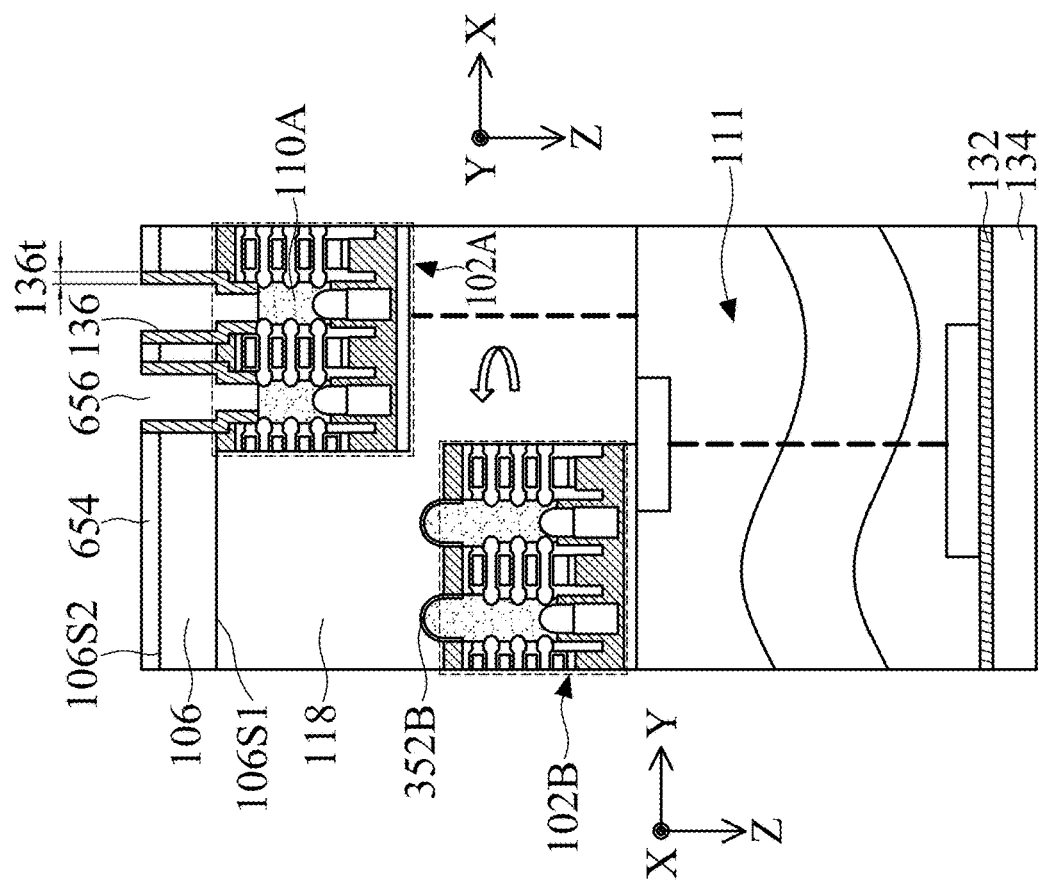
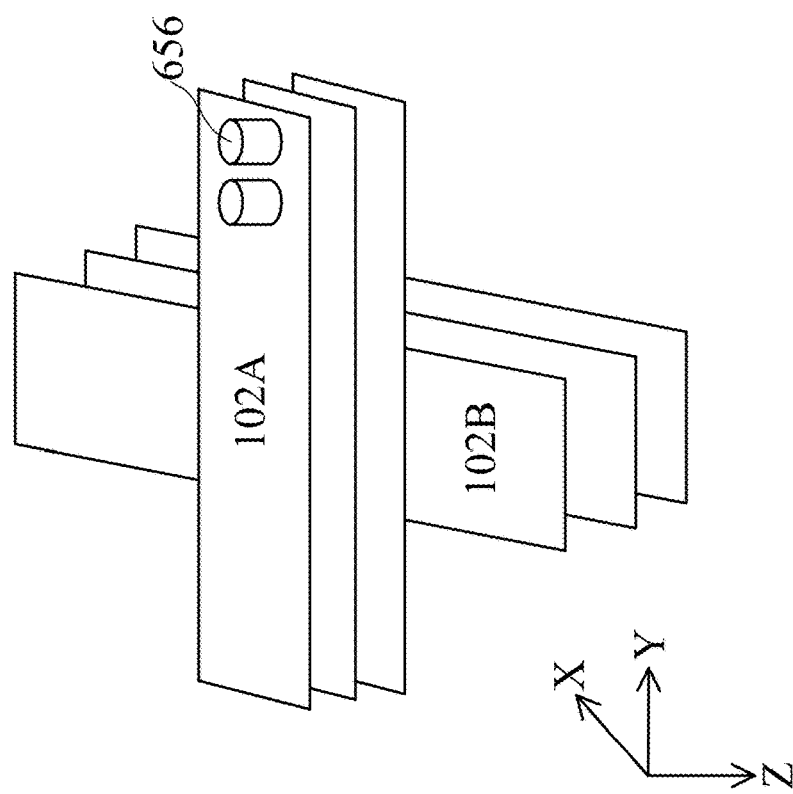
FIG. 6B
FIG. 6A though the substrate itself may be patterned. Materials added on top of the substrate may be patterned or may remain unpatterned. Furthermore, the substrate may be a wide array of semiconductor materials, such as silicon, germanium, gallium arsenide, and indium phosphide. Alternatively, the substrate may be made from an electrically non-conductive material, such as glass and sapphire wafer.

POWER RAILS FOR STACKED SEMICONDUCTOR DEVICE

CROSS-REFERENCE TO RELATED APPLICATION

This application is a divisional application of U.S. patent application Ser. No. 17/663,608, filed on May 16, 2022, titled "Power Rails for Stacked Semiconductor Device," which is a continuation application of U.S. patent application Ser. No. 16/997,062, filed on Aug. 19, 2020, titled "Power Rails for Stacked Semiconductor Device," the disclosures of which are incorporated herein by reference in their entireties.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

FIGS. 1C, 1D, and 1E illustrate an isometric view, a partial cross-sectional view, and a layout view of a crossover-stacked semiconductor device with bottom power rails, respectively, in accordance with some embodiments.

FIGS. 3A-9A illustrate partial isometric views of a crossover-stacked semiconductor device with bottom power rails at various stages of its fabrication process, in accordance with some embodiments.

FIGS. 3B-9B illustrate partial cross-sectional views of a crossover-stacked semiconductor device with bottom power rails at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1B:
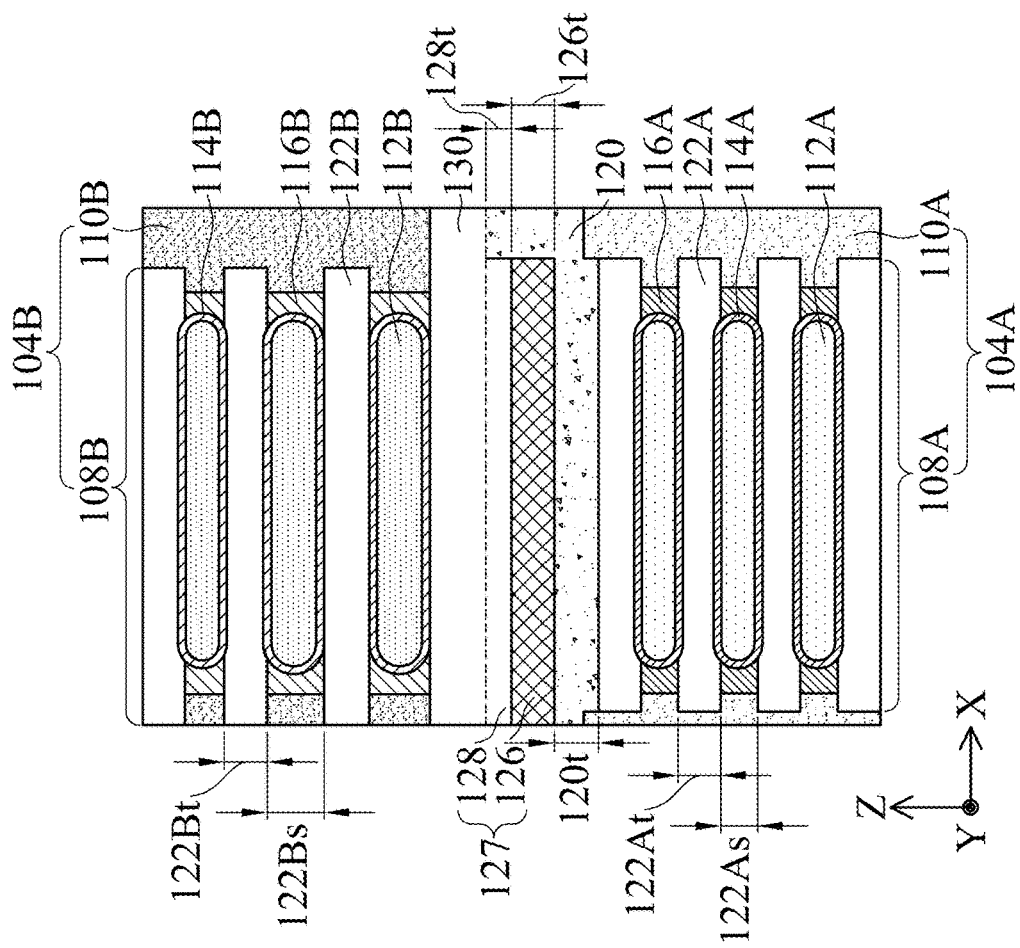
FIGS. 1A and 1B illustrate an isometric view and a partial cross-sectional view of a vertically stacked semiconductor device with bottom power rails, respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials, such as silicon, germanium, gallium arsenide, and indium phosphide. Alternatively, the substrate may be made from an electrically non-conductive material, such as glass and sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than about 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than about 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "vertical," means nominally along a direction perpendicular to the surface of a substrate.

As used herein, the term "crossover," means structures along directions crossing at a point.

In some embodiments, the terms "about" and "substantially" can indicate a value of a given quantity that varies within 5% of the value (e.g., ±1%, 2%, ±3%, ±4%, 5% of the value). These values are merely examples and are not intended to be limiting. The terms "about" and "substantially" can refer to a percentage of the values as interpreted by those skilled in relevant art(s) in light of the teachings herein.

Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

With advances in semiconductor technology, multi-gate devices have been introduced to improve gate control by increasing gate-channel coupling, reduce off-state current, and reduce short-channel effects (SCEs). One such multi-gate device is the gate-all-around fin field effect transistor (GAA finFET). The GAA finFET device provides a channel in a stacked nanosheet/nanowire configuration. The GAA finFET device derives its name from the gate structure that can extend around the channel and provide gate control of the channel on two or four sides of the channel. GAA finFET devices are compatible with MOSFET manufacturing processes and their structure allows them to be scaled while maintaining gate control and mitigating SCEs.

With increasing demand for lower power consumption, high performance, and small area (collectively referred to as "PPA") of semiconductor devices, GAA finFET devices can have their challenges. For example, the stacked nanosheets/nanowires can have undesirable parasitic capacitance between each layer, which can negatively affect device performance of GAA finFET devices. In addition, the stacked nanosheets/nanowires can have reduced active channel area compared with a continuous fin channel, and increasing the number of stacked nanosheets/nanowires layers can increase parasitic capacitances and parasitic resistances of GAA finFET devices. Further, GAA finFET devices in a same plane and fabricated from the same stack of nanosheets/nanowires can take large area, especially with metal interconnects of the GAA finFET devices connected to the source/drain contacts and the gate contacts on the same side of the plane.

Various embodiments in the present disclosure provide methods for forming a stacked semiconductor device with power rails. According to some embodiments, the stacked semiconductor device can include a first GAA finFET having a first fin structure vertically stacked on top of a second GAA finFET having a second fin structure. In some embodiments, the first fin structure and the second fin structure can extend along a same direction (referred to as "vertically stacked"). In some embodiments, the first fin structure can extend along a direction about 90 degrees related to a direction of the second fin structure (referred to as "crossover-stacked"). Crossover-stacked GAA finFETs can reduce parasitic capacitances and resistances and thus improve device performance.

In some embodiments, the first GAA finFET can have a first source/drain (S/D) contact and the second GAA finFET can have a second S/D contact. The first source/drain (S/D) contact and the second S/D contact can both connect to S/D power supply lines on a second surface (e.g., bottom surface) of a substrate (also referred to herein as "bottom power rails"), opposite to a first surface (e.g., top surface) of the substrate which can include first and second GAA finFETs and a gate contact connected to a gate power supply line. In some embodiments, the first S/D contact or the second S/D contact can connect to S/D power supply lines on a second surface (e.g., bottom surface) of the substrate (referred to herein as "bottom power rails"), opposite to the first surface (e.g., top surface) of the substrate, which can include the first and second GAA finFETs 102A and 102B and the gate contact connected to a gate power supply line. In some embodiments, crossover-stacked GAA finFETs with bottom power rails can achieve a device area reduction of about 30% to about 50%. With area reduction and shorter metal interconnects due to bottom power rails, parasitic capacitances and parasitic resistances can be reduced, thus improving device performance. As a result, the voltage drop on the metal interconnects can be reduced by about 30% to about 50%. In some embodiments, cross-over stacked GAA finFETs with bottom power rails can improve overall PPA performance of GAA finFETs.

Figure 1A:
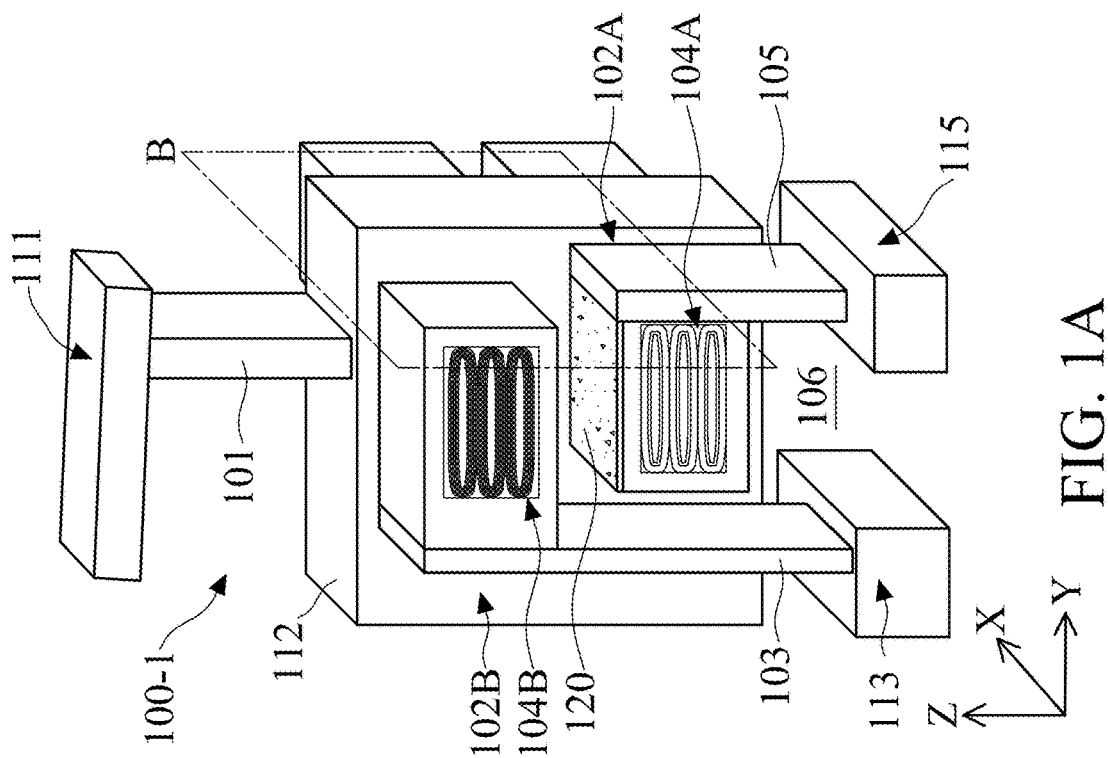

FIG. 1A illustrates an isometric view of a vertically stacked semiconductor device 100-1 with bottom power rails, according to some embodiments. A GAA finFET 102B is vertically stacked on top of a GAA finFET 102A and S/D contacts of GAA finFETs 102A and 102B are connected to bottom power rails. FIG. 1B illustrates a partial cross-sectional view along line B-B of vertically stacked semiconductor device 100-1, according to some embodiments. In some embodiments, FIGS. 1A and 1B show a portion of an IC layout where the dimensions of the fin structures and the dimensions of the gate structures can be similar or different from the ones shown in FIGS. 1A and 1B.

Referring to FIGS. 1A and 1B, vertically stacked semiconductor device 100-1 can include GAA finFETs 102A and 102B, S/D interconnects 113 and 115 connected to respective S/D contacts 103 and 105 of GAA finFETs 102A and 102B, a gate structure 112, and a gate contact 101 connected to gate interconnects 111. GAA finFETs 102A and 102B can further include fin structures 104A and 104B, gate structures 112A and 112B, inner spacer structures 116A and 116B, an isolation structure 120, a doping layer 126, a semiconductor layer 128, and an epitaxial layer 130.

In some embodiments, GAA finFETs 102A and 102B can be both p-type finFETs (PFETs), both n-type finFETs (NFETs), or one of each conductivity type finFET. In some embodiments, GAA finFETs 102A can be p-type (also referred to as "PFET 102A"), GAA finFETs 102B can be n-type (also referred to as "NFET 102B") and vertically stacked semiconductor device 100-1 can be an inverter logic device. Though FIGS. 1A and 1B show two GAA finFETs, vertically stacked semiconductor device 100-1 can have any number of GAA finFETs. Also, though FIGS. 1A and 1B show one gate structure 112, vertically stacked semiconductor device 100-1 can have additional gate structures similar and parallel to gate structure 112. In addition, semiconductor device 100-1 can be incorporated into an integrated circuit through the use of other structural components, such as contacts, conductive vias, conductive lines, dielectric layers, and passivation layers, that are not shown for simplicity. The discussion of elements of GAA finFETs 104A and 104B with the same annotations applies to each other, unless mentioned otherwise.

As shown in FIG. 1A, PFET 102A can be formed on a substrate 106. Substrate 106 can be a semiconductor material, such as silicon (Si). In some embodiments, substrate 106 can include a crystalline silicon substrate (e.g., wafer). In some embodiments, substrate 106 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlInAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

As shown in FIGS. 1A and 1B, semiconductor device 100-1 can include fin structures 104A and 104B extending along an X-axis and through PFET 102A and NFET 102B, respectively. In some embodiments, fin structures 104A and 104B can each include stacked fin portions 108A and 108B and epitaxial fin regions 110A and 110B. Each of stacked fin portions 108A and 108B can include a stack of semiconductor layers 122A and 122B, which can be nanosheets or nanowires. Each of semiconductor layers 122A and 122B can form a channel region underlying gate structures 112A and 112B of PFET 102A and NFET 102B, respectively.

In some embodiments, semiconductor layers 122A and 122B can include semiconductor materials similar to or different from substrate 106. In some embodiments, each of semiconductor layers 122A and 122B can include silicon germanium (SiGe) with Ge in a range from about 5 atomic percent to about 50 atomic percent with any remaining atomic percent being Si or can include Si without any substantial amount of Ge. The semiconductor materials of semiconductor layers 122A and 122B can be undoped or can be in-situ doped during its epitaxial growth process using: (i) p-type dopants, such as boron, indium, and gallium; and/or (ii) n-type dopants, such as phosphorus and arsenic. Semiconductor layers 122A and 122B can have respective thicknesses 122At and 122Bt along a Z-axis, each ranging from about 5 nm to about 12 nm. In some embodiments, thickness 122At can be the same as or different from thickness 122Bt. Semiconductor layers 122A and 122B can also have respective spacings 122As and 122Bs along a Z-axis between each other, each ranging from about 6 nm to about 16 nm. In some embodiments, spacing 122As can be the same as or different from spacing 122Bs. Though three layers of semiconductor layers 122A and 122B for each of PFET 102A and NFET 102B are shown in FIGS. 1A and 1B, PFET 102A and NFET 102B can each have any number of semiconductor layers 122A and 122B.

Referring to FIGS. 1A and 1B, epitaxial fin regions 110A and 110B can be disposed adjacent to stack fin portions 108A and 108B, respectively. In some embodiments, epitaxial fin regions 110A and 110B can have any geometric shape, such as a polygon, an ellipsis, and a circle. Epitaxial fin regions 110A and 110B can include an epitaxially-grown semiconductor material. In some embodiments, the epitaxially grown semiconductor material is the same material as substrate 106. In some embodiments, the epitaxially-grown semiconductor material includes a different material from substrate 106. In some embodiments, the epitaxially-grown semiconductor material for epitaxial fin regions 110A and 110B can be the same as or different from each other. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, epitaxial fin regions 110A can be p-type for PFET 102A (also referred to as "p-type epitaxial fin regions 110A") and epitaxial fin regions 110B can be n-type for NFET 102B (also referred to as "n-type epitaxial fin regions 110B"). In some embodiments, p-type epitaxial fin regions 110A can include SiGe and can be in-situ doped during an epitaxial growth process using p-type dopants, such as boron, indium, and gallium. In some embodiments, p-type epitaxial fin regions 110A can have multiple sub-regions that can include SiGe and can differ from each other based on, for example, doping concentration, epitaxial growth process conditions, and/or relative concentration of Ge with respect to Si.

In some embodiments, n-type epitaxial fin regions 110B can include Si and can be in-situ doped during an epitaxial growth process using n-type dopants, such as phosphorus and arsenic. In some embodiments, n-type epitaxial fin regions 110B can have multiple n-type epitaxial fin sub-regions that can differ from each other based on, for example, doping concentration and/or epitaxial growth process conditions.

Referring to FIGS. 1A and 1B, stacked fin structures 104A and 104B can be current-carrying structures for respective PFET 102A and NFET 102B. Channel regions of PFET 102A and NFET 102B can be formed in portions of their respective stacked fin structures 104A and 104B underlying gate structures 112A and 112B. Epitaxial fin regions 110A and 110B can function as source/drain (S/D) regions of respective PFET 102A and NFET 102B.

According to some embodiments, fin structures 104B can be stacked on top of fin structures 104A and isolated by isolation structure 120, as shown in FIGS. 1A and 1B. In some embodiments, stacked fin structures 104A and 104B can provide independent control of dimensions and spacings of semiconductor layers 122A and 122B respectively. According to some embodiments, isolation structure 120 can isolate PFET 102A and NFET 102B. In some embodiments, additional isolation structures between stacked fin structures 104A and 104B can further improve the isolation. According to some embodiments, isolation structure 120 can include insulating materials, such as silicon oxide, silicon nitride, a low-k material, other suitable insulating materials, and a combination thereof. In some embodiments, isolation structure 120 can include a first portion on stacked fin portions 108A and a second portion on epitaxial fin regions 110A. In some embodiments, isolation structure 120 can have a vertical dimension (e.g., thickness) 120t along a Z-axis ranging from about 5 nm to about 10 nm.

As shown in FIGS. 1A and 1B, NFET 102B can be formed on epitaxial layer 130, semiconductor layer 128, and doping layer 126 above PFET 102A. In some embodiments, semiconductor layer 128 and doping layer 126 can serve as a substrate layer 127 for NFET 102B. Doping layer 126 can be disposed in contact with isolation structure 120 above PFET 102A and include semiconductor materials similar to or different from substrate 106. In some embodiments, doping layer 126 can include Si. In some embodiments, the semiconductor materials of doping layer 126 can be in-situ doped using a similar epitaxial growth process as semiconductor layers 122A and 122B. Doping layer 126 can have a thickness 126t along a Z-axis ranging from about 5 nm to about 10 nm. In some embodiments, doping layer 126 can be doped with a different conductivity type from substrate 106, such as p-type for doping layer 126 and n-type for substrate 106. In some embodiments, doping layer 126 can serve as an implant well for NFET 102B.

Semiconductor layer 128 can be disposed on doping layer 126 and include semiconductor materials similar to or different from doping layer 126. In some embodiments, semiconductor layer 128 can include Si. The semiconductor materials of semiconductor layers 122 can be undoped or can be in-situ doped using a similar epitaxial growth process as doping layer 126. Semiconductor layer 128 can have a thickness 128t along a Z-axis ranging from about 12 nm to about 20 nm. In some embodiments, semiconductor layer 128 can help subsequent growth of epitaxial layer 130 and fin structure 104B.

Epitaxial layer 130 can be disposed on top of semiconductor layer 128 and isolation structure 120. In some embodiments, epitaxial layer 130 can be epitaxially grown on semiconductor layer 128 and merge over the portion of isolation structure 120 on epitaxial fin regions 110A. In some embodiments, epitaxial layer 130 can help subsequent growth of fin structure 104B. In some embodiments, epitaxial layer 130 can include Si without any substantial amount of Ge. In some embodiments, epitaxial layer 130 can have a thickness 130t along a Z-axis ranging from about 10 nm to about 20 nm.

Referring to FIGS. 1A and 1B, gate structures 112A and 112B can be multi-layered structures and can be wrapped around stacked fin portions 108A and 108B. In some embodiments, each of semiconductor layers 122A and 122B of stacked fin portions 108A and 108B can be wrapped around by one of gate structures 112A and 112B or one or more layers of one of gate structures 112A and 112B respectively, for which gate structures 112A and 112B can be referred to as "gate-all-around (GAA) structures" or "horizontal gate-all-around structures" and finFETs 102A and 102B can be referred to as "GAA FETs" or "GAA finFETs."

In some embodiments, gate structures 112A and 112B can include single layer or a stack of layers of gate electrode wrapping around semiconductor layers 122A and 122B respectively. In some embodiments, PFET 102A can include p-type work function materials for a gate electrode of gate structure 112A. In some embodiments, NFET 102B can include n-type work function materials for a gate electrode of gate structure 112B. In some embodiments, the gate electrodes of gate structures 112A and 112B can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), metal alloys, or combinations thereof.

In some embodiments, gate dielectric layers 114A and 114B can be disposed between semiconductor layers 122A and 122B and gate structures 112A and 112B, respectively. In some embodiments, gate dielectric layers 114A and 114B can include (i) a layer of silicon oxide, silicon nitride, and/or silicon oxynitride, (ii) a high-k dielectric material, such as hafnium oxide ($HfO_2$), (iii) a negative capacitance (NC) dielectric material doped with aluminum (Al), gadolinium (Gd), silicon (Si), strontium (Sr), scandium (Sc), yttrium (Y), zirconium (Zr), lanthanum (La), or (iv) a combination thereof. In some embodiments, gate dielectric layers 114A and 114B can include a single layer or a stack of insulating material layers.

In some embodiments, gate dielectric layers 114A and 114B can include an NC dielectric material with ferroelectric properties, such as hafnium oxide ($HfO_2$), hafnium aluminum oxide (HfAlO), hafnium silicate (HfSiO), hafnium zirconium oxide (HfZrO), and the like. The ferroelectric property of the dielectric material of gate dielectric layers 114A and 114B can be affected by various factors including, but not limited to, the atomic elements of the dielectric material, the atomic percentage of the atomic elements, and/or the phase of the crystal structure of the dielectric material. The phase can also be affected by the deposition process conditions and post-treatment conditions for forming the dielectric material. Thus, a dielectric material having the same atomic elements and/or the same atomic percentages of the atomic elements as the dielectric material of gate dielectric layers 114A and 114B may not exhibit negative capacitance property, and thus, many not be considered as an NC dielectric material.

In some embodiments, gate dielectric layers 114A and 114B can include a high-k dielectric material in orthorhombic phase (e.g., high-k $HfO_2$ in orthorhombic phase) and/or a high-k dielectric material subjected to one or more treatment methods, such as doping, stressing, and thermal annealing. In some embodiments, gate dielectric layers 114A and 114B can include a stable orthorhombic phase NC dielectric material formed by doping and/or thermal annealing $HfO_2$ with metals, such as aluminum (Al), gadolinium (Gd), silicon (Si), yttrium (Y), zirconium (Zr), and a combination thereof. Other materials and formation methods for NC dielectric materials of gate dielectric layers 114A and 114B are within the scope and spirit of this disclosure.

The NC dielectric material in gate dielectric layers 114A and 114B can reduce a subthreshold swing (SS) through internal voltage amplification mechanism and increase a channel on-current to off-current (Ion/Ioff) ratio of GAA finFETs 102A and 102B, thus achieving faster device operation along with lower power consumption. In some embodiments, the power consumption can be reduced by about 30% to about 50%. In some embodiments, fin structures 104A and 104B can have each one or more NC layers between respective semiconductor layers 122A and 122B to reduce parasitic capacitances for GAA finFETs 102A and 102B.

Referring to FIGS. 1A and 1B, inner spacer structures 116A and 116B can be disposed between epitaxial fin regions 110A and 110B and portions of gate structures 112A and 112B, according to some embodiments. Inner spacer structures 116A and 116B can include a dielectric material, such as SiOC, SiCN, SiOCN, SiN, silicon oxide ($SiO_x$), silicon oxynitride ($SiO_yN$), and a combination thereof. In some embodiments, inner spacer structures 116A and 116B can include a single layer or multiple layers of insulating materials. In some embodiments, inner spacer structures 116A and 116B can isolate gate structures 112A and 112B and epitaxial fin regions 110A and 110B.

Referring to FIGS. 1A and 1B, gate interconnects 111 can be connected to a gate power supply line, and S/D interconnects 113 and 115 can be connected to S/D power supply and ground lines. In some embodiments, gate interconnects 111 can be connected to a gate power supply line above PFET 102A and NFET 102B on a first surface of substrate 106, and S/D interconnects 113 and 115 can be connected to S/D power supply and ground lines below PFET 102A and NFET 102B on a second surface of substrate 106 (also referred to herein as "bottom power rails"). The first surface can be opposite to the second surface. For example, the drain side of PFET 102A can be connected to a buried Vdd power supply line, and the source side of NFET 102B can be connected to a buried Vss power supply line. The bottom power rails can reduce device areas and interconnects, thus reducing power consumption. In some embodiments, compared with GAA finFETs without stacked fin structures and bottom power rails, vertically stacked GAA finFETs with bottom power rails can achieve a device area reduction of about 30% to about 50% and a power consumption reduction of about 30% to about 50%.

In some embodiments, gate interconnects 111 can be connected to gate structures 112A and 112B through gate contacts 101. In some embodiments, S/D interconnects 113 and 115 can be connected to S/D regions of PFET 102A and NFET 102B through S/D contacts 103 and 105, respectively. In some embodiments, gate contacts 112A and 112B and S/D contacts 103 and 105 can include a silicide layer and a metal contact. Examples of metal used for forming the silicide layer are Co, Ti, and Ni. In some embodiments, the metal contact can include, for example, tungsten (W), cobalt (Co), aluminum (Al), copper (Cu), titanium (Ti), tantalum (Ta), titanium nitride (TiN), tantalum nitride (TaN), nickel silicide (NiSi), silver (Ag), ruthenium (Ru), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, or combinations thereof.

In some embodiments, semiconductor device 100-1 can further include STI regions, gate dielectric layers, interlayer dielectric (ILD) layers, etch stop layer (ESL), and other suitable layers and structures, which are not shown for simplicity.

FIGS. 1C and 1D illustrate an isometric view and a partial cross-sectional view of a crossover-stacked semiconductor device 100-2 with bottom power rails, respectively, in accordance with some embodiments. For illustration purposes, the cross-sectional view of NFET 102B in FIG. 1D is rotated about 90 degrees to be shown together with the cross-sectional view of PFET 102A. The dots between PFET 102A and gate interconnects 111 can represent one or more layers between them, which are not described in detail. Elements in FIGS. 1C-1D with the same annotations as elements in FIGS. 1A-1B are described above. As shown in FIG. 1C, the fin structure of PFET 102A can extend along a direction about 90 degrees to a direction that the fin structure of NFET 102B can extend. In some embodiments, gate contact structure 101 and gate interconnects 111 can be fabricated on a first surface of substrate 106 connected to gate structure 112B of NFET 102B. The dots in gate interconnects can represent one or more layers (e.g., one or more metal lines and/or metal vias) in gate interconnects 111. In some embodiments, substrate 106 with PFET 102A and NFET 102B can be bonded to a carrier substrate 134 by a bonding layer 132 on the first surface (e.g., on the same side of PFET 102A and NFET 102B). In some embodiments, carrier substrate 134 can include semiconductor materials similar to or different from substrate 106. In some embodiments, carrier substrate 134 can include silicon. In some embodiments, bonding layer 132 can include silicon oxide or other suitable materials to bond carrier substrate 134 to substrate 106. In some embodiments, bonding layer 132 can have a thickness 132t along a Z-axis ranging from about 20 nm to about 50 nm.

In some embodiments, S/D contact structures 103 and 105, S/D interconnects 113 and 115, and bottom power rails can be fabricated on a second surface of substrate 106 connected to S/D regions of PFET 102A and NFET 102B (e.g., on the opposite side of PFET 102A and NFET 102B). The second surface is opposite to the first surface. In some embodiments, crossover-stacked semiconductor device 100-2 can further reduce the device area and parasitic capacitances. In some embodiments, compared with GAA finFETs without stacked fin structures and bottom power rails, crossover-stacked GAA finFETs with bottom power rails can achieve improved device performance, in addition to a device area reduction of about 30% to about 50% and a power consumption reduction of about 30% to about 50%.

Referring to FIG. 1D, crossover-stacked semiconductor device 100-2 can further include shallow trench isolation (STI) regions 118, a dielectric barrier 136, a dielectric layer 138, contact layers 144A and 144B, block structures 146A and 146B, and cap structures 148A and 148B. S/D contact structures 103 of NFET 102B can include silicide layers 140B and metal contacts 142B. S/D contact structure 105 of PFET 102A can include silicide layers 140A and metal contacts 142A.

STI regions 118 can provide electrical isolation between PFET 102A and NFET 102B from each other and from neighboring GAA finFETs with different fin structures (not shown) on substrate 106 and/or neighboring active and passive elements (not shown) integrated with or deposited on substrate 106. STI regions 118 can be made of a dielectric material. In some embodiments, STI regions 104 can include silicon oxide, silicon nitride, silicon oxynitride, fluorine-doped silicate glass (FSG), a low-k dielectric material, and/or other suitable insulating materials.

Dielectric layer 138 can include the same insulating material as STI regions 118. In some embodiments, dielectric layer 138 can include silicon oxide. In some embodiments, dielectric layer 138 can improve isolation between adjacent S/D contacts. Dielectric barrier 136 can include a dielectric material to isolate S/D contact structures 103 and 105 from surrounding structures. In some embodiments, dielectric barrier 136 can include silicon nitride. Contact layers 144A and 144B can connect epitaxial fin regions 110A and 110B respectively to S/D contacts if the S/D contacts are fabricated on the same surface of substrate 106 as gate structures 112A and 112B. In some embodiments, contact layers 144A and 144B can include silicide, metals, and other suitable conductive materials. Block structure 146A and 146B can block the connection of S/D regions (e.g., epitaxial fin regions 110A and 110B) to interconnects on the same surface of substrate 106 as gate structures 112A and 112B. In some embodiments, block structure 146A and 146B can include a dielectric material of silicon oxide. Cap structures 148A and 148B can block the connection of S/D regions (e.g., epitaxial fin regions 110A and 110B) to interconnects on the same surface of substrate 106 as gate structures 112A and 112B. In some embodiments, cap structure 148A and 148B can include a dielectric material of silicon nitride.

FIG. 1E is a layout view of crossover-stacked semiconductor device 100-2 with bottom power rails, in accordance with some embodiments. With bottom power rails, metal interconnects can be easier for placing and routing design as compared to a semiconductor device without the bottom power rails. As shown in FIG. 1E, the layout view can be compact and achieve a device area reduction of about 30% to about 50% compared with GAA finFETs without stacked fin structures and bottom power rails.

Figure 2:
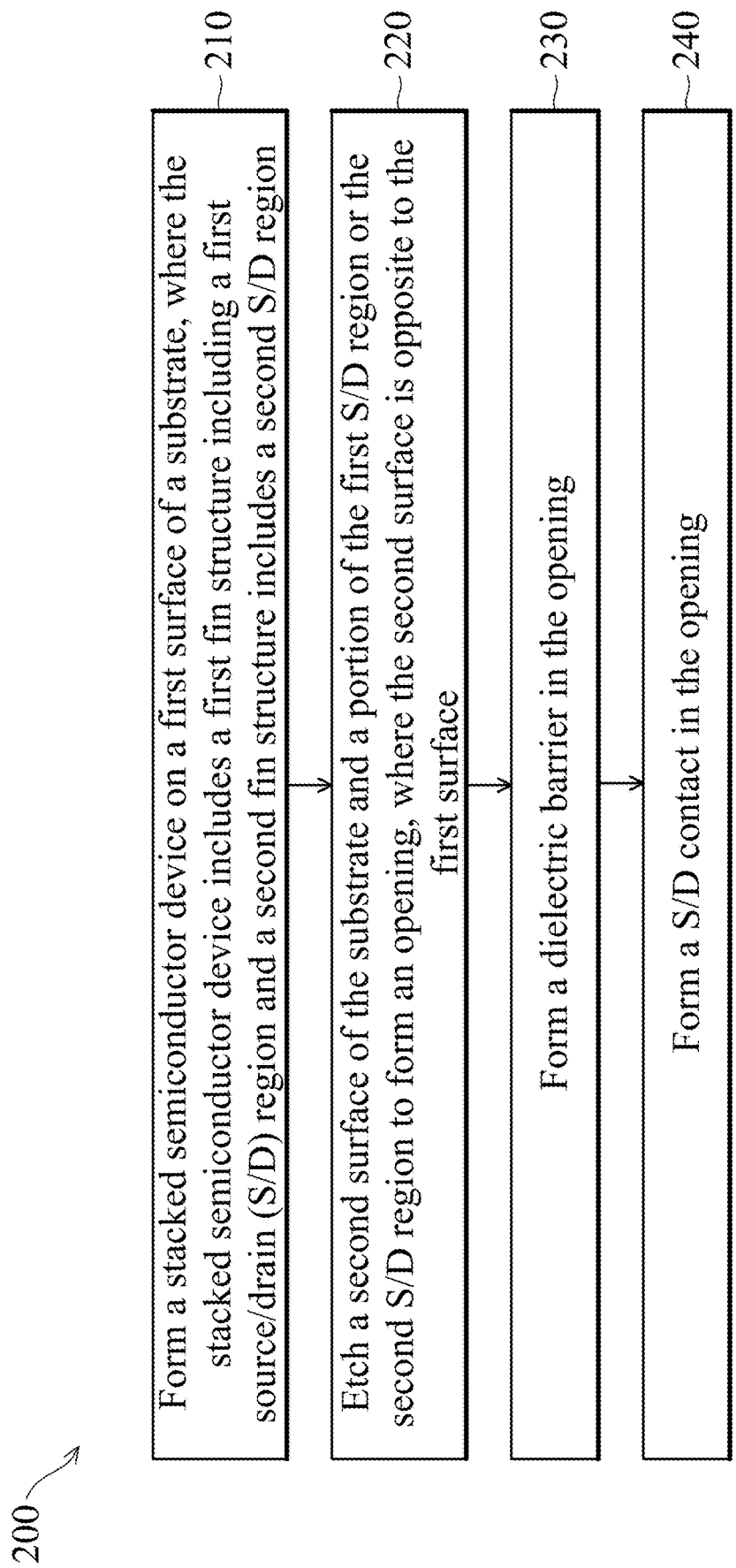
FIG. 2 is a flow diagram of a method for fabricating a crossover-stacked semiconductor device with bottom power rails, in accordance with some embodiments.

FIG. 2 is a flow diagram of a method 200 for fabricating crossover-stacked semiconductor device 100-2 with bottom power rails, in accordance with some embodiments. Additional fabrication operations may be performed between various operations of method 200 and may be omitted merely for clarity and ease of description. Additionally, some of the operations may be performed simultaneously, or in a different order than the ones shown in FIG. 2. Accordingly, additional processes can be provided before, during, and/or after method 200; these additional processes can be briefly described herein. For example purposes, the operations illustrated in FIG. 2 will be described with reference to the example fabrication process for fabricating crossover-stacked semiconductor device 100-2 as illustrated in FIGS. 3A-10B. FIGS. 3A-9A are isometric views of semiconductor device 100-2 of FIG. 1C at various stages of its fabrication, according to some embodiments. FIGS. 3B-9B, 10A, and 10B are partial cross-sectional views of semiconductor device 100-2 of FIG. 1C at various stages of its fabrication, according to some embodiments. Although FIGS. 3A-10B illustrate fabrication processes of crossover-stacked semiconductor device 100-2 with bottom power rails, method 200 can be applied to vertically stacked semiconductor device 100-1 with bottom power rails and other semiconductor devices. Elements in FIGS. 3A-10B with the same annotations as elements in FIGS. 1A-1E are described above.

In referring to FIG. 2, method 200 begins with operation 210 and the process of forming a stacked semiconductor device on a first surface of a substrate. The stacked semiconductor device includes a first fin structure, an isolation structure on the first fin structure, and a second fin structure above the first fin structure and in contact with the isolation structure. The first fin structure includes a first source/drain (S/D) region and the second fin structure includes a second S/D region. For example, as shown in FIGS. 3A-3B, crossover-stacked semiconductor device 100-2 can be formed on a first surface 106S1 of substrate 106. FIGS. 3A and 3B illustrate a partial isometric view and partial cross-sectional view of crossover-stacked semiconductor device 100-2, according to some embodiments. Similar to FIG. 1D, the cross-sectional view of NFET 102B in FIG. 3B and the subsequent cross-sectional view figures are rotated about 90 degrees for illustration purposes. Crossover-stacked semiconductor device 100-2 can include first fin structure 104A, isolation structure 120 on fin structure 104A, and second fin structure 104B above fin structure 104A and in contact with isolation structure 120. Fin structures 104A and 104B can include epitaxial fin regions 110A and 1110B, respectively. Gate contact structure 101 and gate interconnects 111 (e.g., metal lines M0, M1, and Mn, and vias V0, V1, and Vn, where n is an integer) can connect gate structures 112B and 112A to a gate power supply line.

The formation of crossover-stacked semiconductor device 100-2 can include the formation of fin structure 104A on surface 106S1 of substrate 106, formation of isolation structure 120 on fin structure 104A, and formation of fin structure 104B on isolation structure 120. The formation of fin structure 104A can include epitaxially growing a stack of semiconductor layers on substrate 106. The semiconductor layers can include semiconductor materials with oxidation rates and/or etch selectivity different from each other. Epitaxial fin regions 110A can be formed adjacent to the semiconductor layers. A subset of the semiconductor layers can be replaced with gate structure 112A wrapped around fin structure 104A. A sacrificial semiconductor layer can be epitaxially grown on the fin structure and subsequently replaced by isolation structure 120. Substrate layer 127 and epitaxial layer 130 can be formed on isolation structure to facilitate the epitaxial growth of an additional stack of semiconductor layers, which can subsequently form fin structure 104B. Epitaxial fin regions 110B can be formed adjacent to the additional semiconductor layers. A subset of the additional semiconductor layers can be replaced with gate structure 112B wrapped around fin structure 104B.

In some embodiments, epitaxial fin regions 110A and 110B can include stop layers 352A and 352B, respectively, adjacent to second surface 106S2. In some embodiments, stop layers 352A and 352B can each be epitaxially grown and in-situ doped with a stop dopant. In some embodiments, stop layers 352A and 352B can have a thickness 352At and a thickness 352Bt, each ranging from about 3 nm to about 5 nm. In some embodiments, the concentration of the stop dopant in stop layers 352A and 352B can range from about 10 atomic percent to about 50 atomic percent.

The stop dopants in stop layers 352A and 352B can stop the subsequent etching process of substrate 106 on epitaxial fin regions 110A and 110B. If thicknesses 352At and 352Bt are less than about 3 nm, the etching process may not stop on stop layers 352A and 352B of epitaxial fin regions 110A and 110B. If thicknesses 352At and 352Bt are greater than about 5 nm, stop layers 352A and 352B may have defects and stress, thus negatively affecting the electrical properties of epitaxial fin regions 110A and 110B. If the concentration of the stop dopant is lower than about 10 atomic percent, the etch selectivity between the substrate and the stop layers may not be sufficient for the etching process to stop on stop layers 352A and 352B. If the concentration of the stop dopant is higher than about 50 atomic percent, stop layers 352A and 352B may have defects and stress, thus negatively affecting the electrical properties of epitaxial fin regions 110A and 110B.

The formation of crossover-stacked semiconductor device 100-2 can be followed by formation of bonding layer 132, as shown in FIGS. 3A and 3B. In some embodiments, bonding layer 132 can include a dielectric material of silicon oxide deposited by a high-density plasma (HDP) deposition process. In some embodiments, bonding layer 132 can include other suitable materials to bond a carrier substrate to bonding layer 132. In some embodiments, bonding layer 132 can have a thickness 132$t$ along a Z-axis ranging from about 20 nm to about 50 nm.

Figures 4A, 4B:
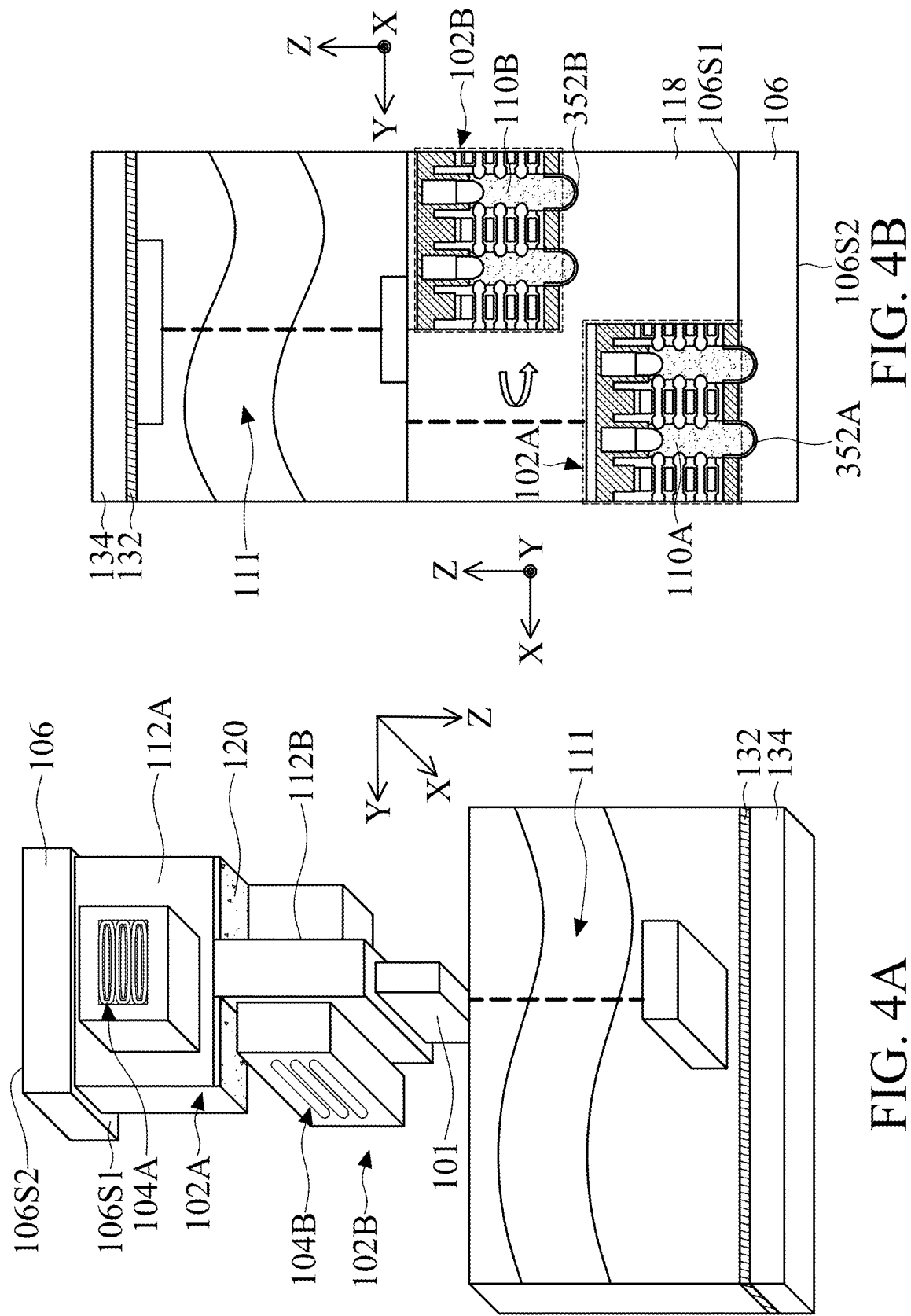

The formation of bonding layer 132 can be followed by bonding carrier substrate 134 to bonding layer 132, as shown in FIGS. 4A and 4B. In some embodiments, carrier substrate 134 and bonding layer 132 can be bonded together by a pressure bonding process. In some embodiments, the pressure bonding process can be performed with a pressure from about 30 mbar to about 80 mbar at an annealing temperature from about 300° C. to about 350° C. The bonding force can range from about 3 N to about 5 N, and the bond strength of the oxide-oxide bond formed in the pressure bonding process can rang from about 1.5 J/m$^2$ to about 1.7 J/m$^2$.

The bonding of carrier substrate 134 to bonding layer 132 can be followed by flipping carrier substrate 106 above carrier substrate 134 and a substrate polishing process on a second surface 106S2 of substrate 106, as shown in FIGS. 4A and 4B. Second surface 106S2 can be a bottom surface of substrate 106 opposite to first surface 106S1 of substrate 106 having crossover-stacked semiconductor device 100-2. In some embodiments, the substrate polishing process can include a grinding process, a trimming process, a thinning process, and a chemical mechanical polishing (CMP) process. After the grinding process, substrate 106 can have a thickness along a Z-axis ranging from about 70 μm to about 100 μm. Second surface 106S2 of substrate 106 can be rough after the grinding process. The trimming process can remove particles on the edge to protect semiconductor devices on first surface 106S1. The thinning process can continue removing substrate 106 in smaller steps to have a smoother second surface 106S2 and avoid over-polishing. In some embodiments, after the thinning process, substrate 106 can have a thickness along a Z-axis ranging from about 5 μm to about 25 μm. After the CMP process, substrate 106 can have a thickness along a Z-axis ranging from about 100 nm to about 1 μm. Second surface 106S2 can be smoother and transparent after the CMP process. In some embodiments, crossover-stacked semiconductor device 100-2 can be observed through second surface 106S2 after the CMP process. In some embodiments, a patterning process can be performed on second surface 106S2 of substrate 106 to form S/D contacts on S/D regions of PFET 102A and NFET 102B.

Figure 5B:
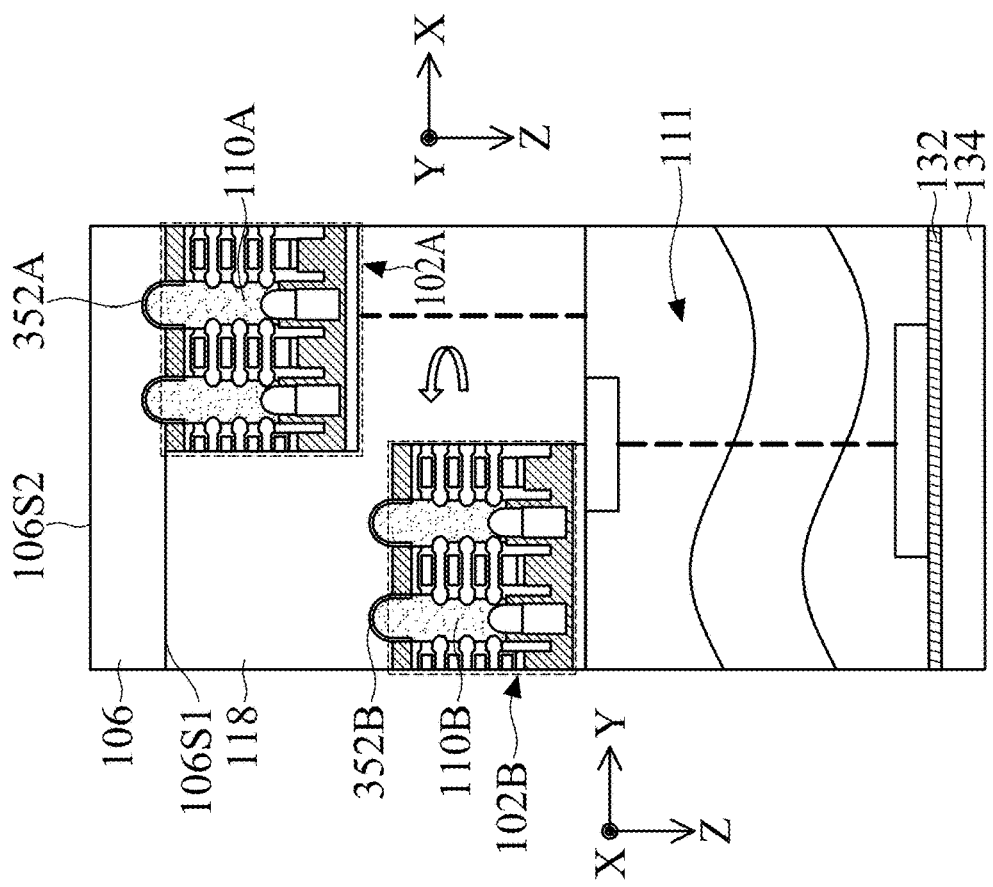
Figure 5A:
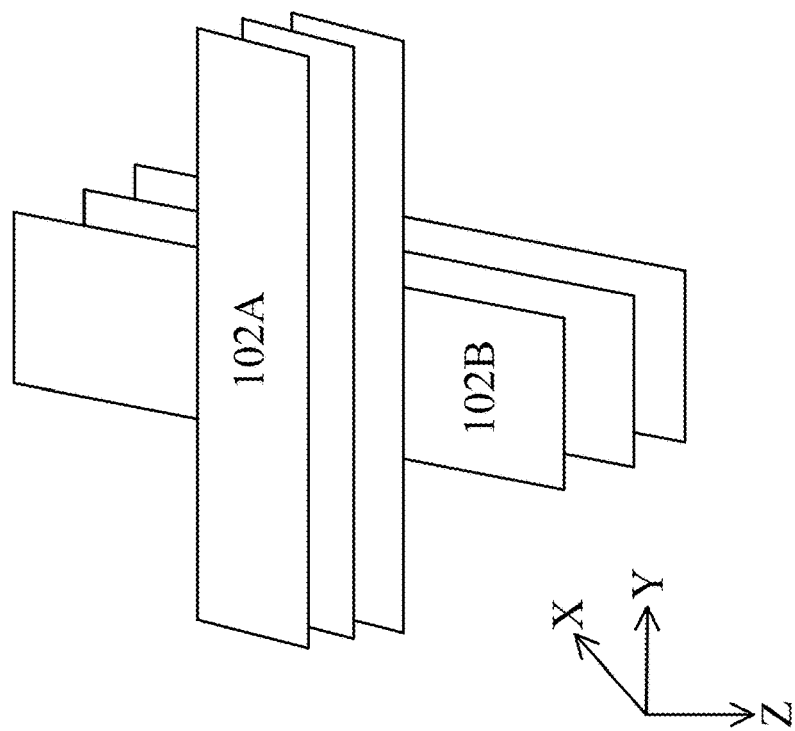

FIG. 5A illustrates a partial isometric view of crossover-stacked semiconductor device 100-2, according to some embodiments. FIG. 5A can illustrate the crossover stacking of the fin structures of PFET 102A and NFET 102B. FIG. 5B illustrate a partial cross-sectional view of crossover-stacked semiconductor device 100-2 after the CMP process.

In operation 220 of FIG. 2, a second surface of the substrate and a portion of the first S/D region or the second S/D region are etched to form an opening. The second surface is opposite to the first surface. For example, as shown in FIGS. 6A and 6B, a hard mask layer 654 can be deposited on second surface 106S2 of substrate 106 and hard mask layer 654 can be patterned to expose portions of second surface 102S2 above the S/D regions of PFET 102A. Exposed portions of second surface 106S2 of substrate 106 and portions of S/D regions (e.g., epitaxial fin regions 110A) of PFET 102A can be etched by a directional etching process. In some embodiments, the direction etching process can include a reactive ion etching (RIE) process. In some embodiments, stop layers 352A in epitaxial fin regions 110A can stop the directional etching process. After the directional etching process, openings 656 can be formed in substrate 106 and epitaxial fin regions 110A.

In operation 230 of FIG. 2, a dielectric barrier can be formed in the opening. For example, as shown in FIGS. 6A and 6B, dielectric barrier 136 can be formed in openings 656. In some embodiments, the formation of dielectric barrier 136 can include depositing a dielectric barrier layer and etching a portion of the dielectric layer on epitaxial fin regions 110A. In some embodiments, the depositing process can include a blanket deposition of the dielectric barrier layer in openings 656 and on hard mask layer 654 using chemical vapor deposition (CVD), atomic layer deposition (ALD), or other suitable deposition processes. In some embodiments, the dielectric barrier layer can include silicon nitride. In some embodiments, the dielectric barrier layer can isolate subsequently-formed S/D contact structures from surrounding structures (e.g., substrate 106). In some embodiments, the dielectric barrier layer can have a thickness 136t ranging from about 3 nm to about 5 nm. If thickness 136t is less than about 3 nm, dielectric barrier 136t may not isolate subsequently-formed S/D contact structures from surrounding structures. If thickness 136t is greater than about 5 nm, the diameter of openings 656 may be reduced and S/D contact structures may not be formed in openings 656.

The blanket deposition of the dielectric barrier layer can be followed by etching a portion of the dielectric barrier layer on epitaxial fin regions 110A. In some embodiments, the etching process can include a directional etch of the blanket deposited dielectric barrier layer on epitaxial fin regions 110A and hard mask layer 654. In some embodiments, the directional etching process can include an RIE process. After the direction etching process, epitaxial fin regions 110A can be exposed for formation of S/D contacts.

Figure 7B:
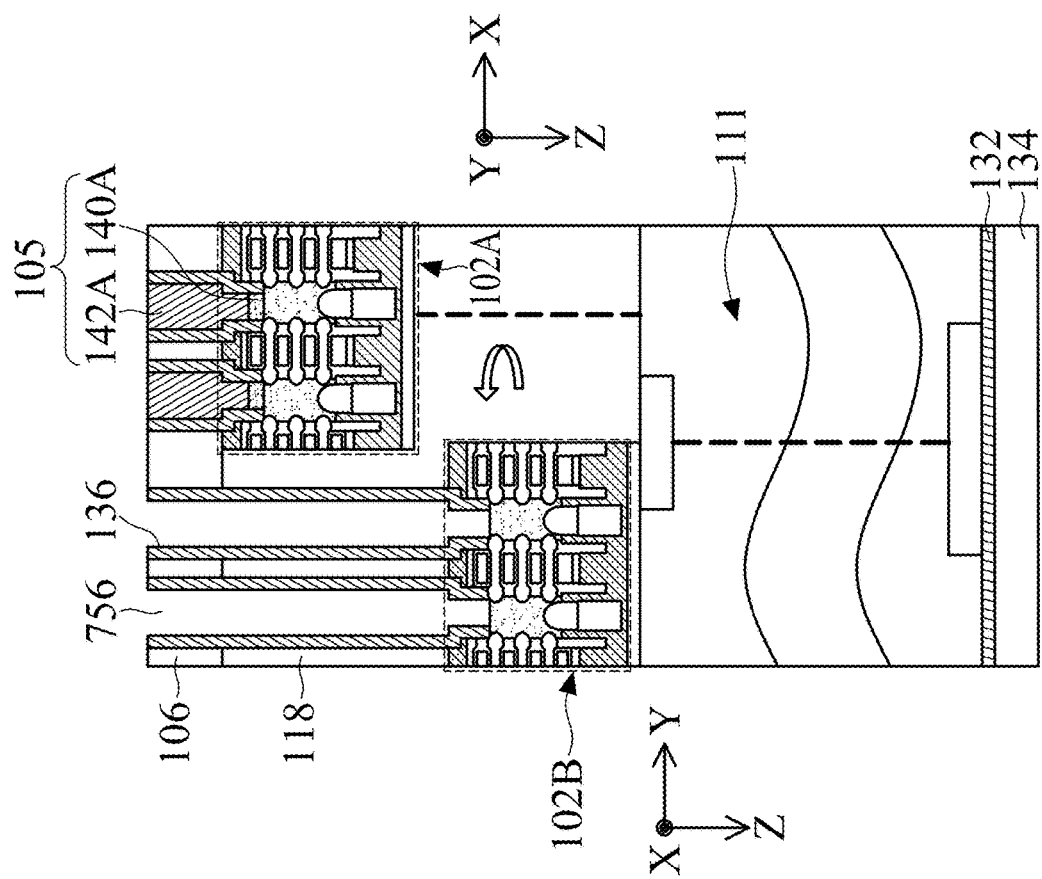
Figure 7A:
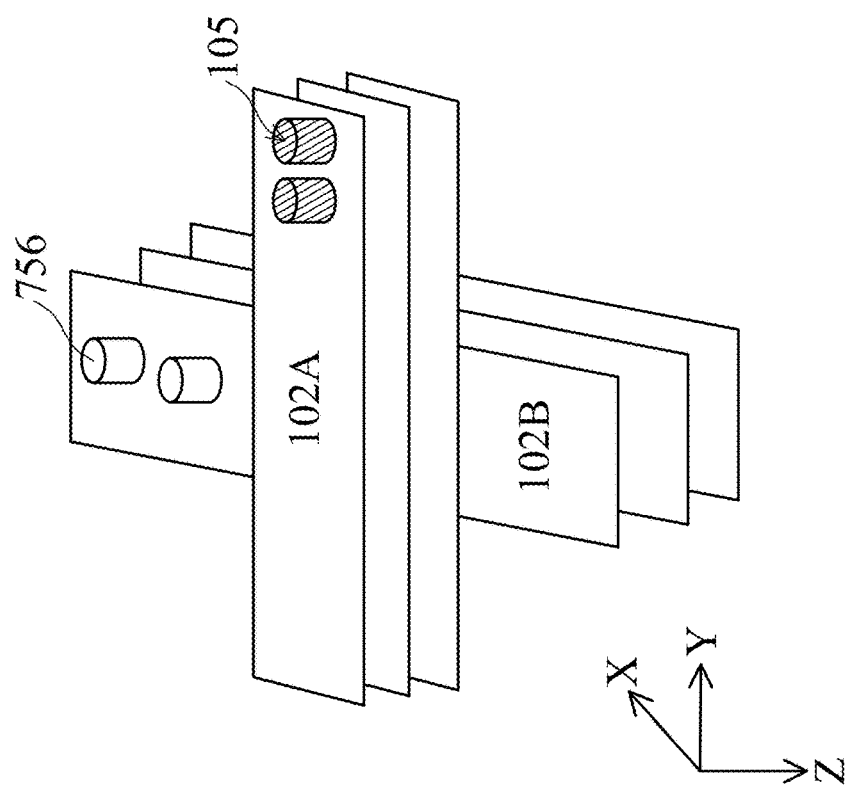
Figure 8B:
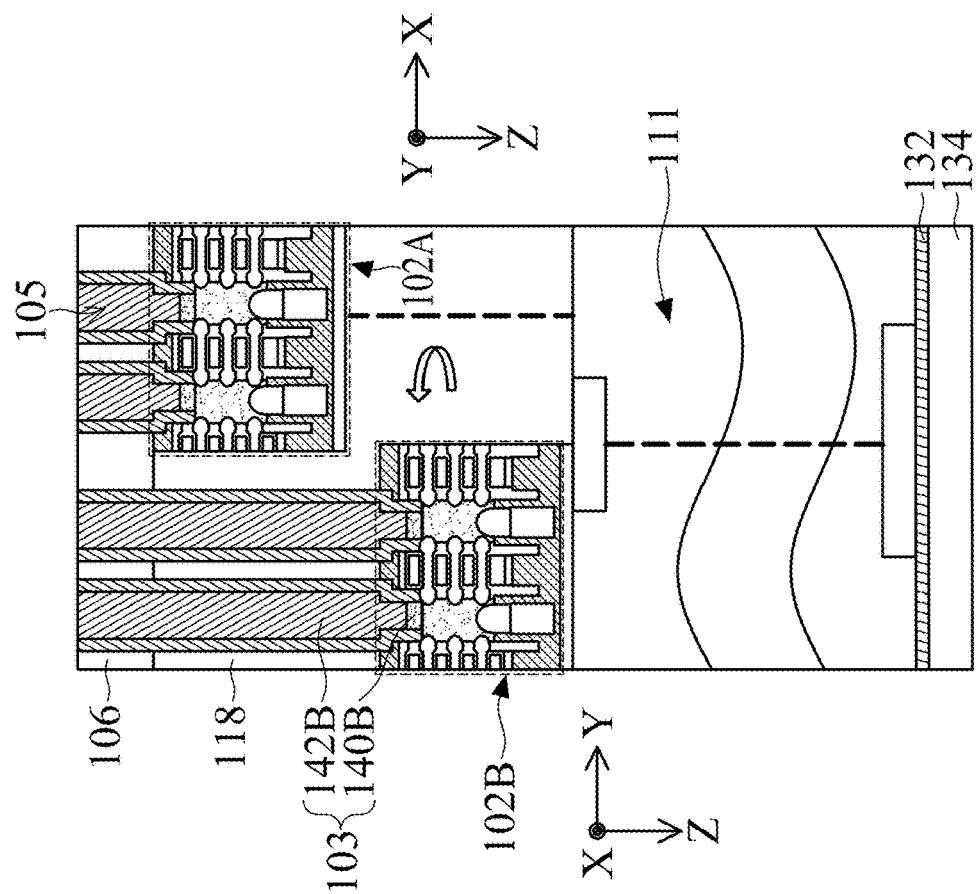
Figure 8A:
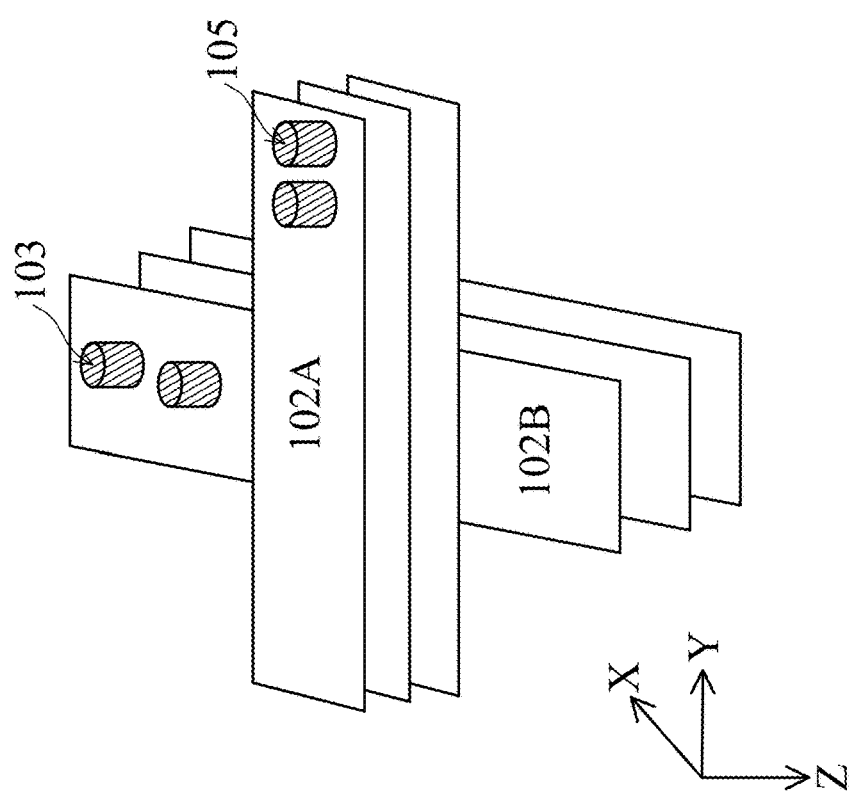

Referring to FIG. 2, in operation 240, an S/D contact can be formed in the opening. For example, as shown in FIG. 7B, S/D contact 105 can be formed in openings 656 shown in FIG. 6B. The formation of S/D contact 105 can include formation of silicide layers 140A and formation of metal contacts 142A. Silicide layers 140A can provide a low resistance interface between epitaxial fin regions 110A and metal contacts 142A. In some embodiments, the formation of silicide layers 140A can include depositing a layer of metal and annealing the layer of metal to form silicide layers. In some embodiments, silicide layers 140A can include Co, Ni, Ti, W, Mo, Ti, nickel cobalt alloy (NiCo), Pt, nickel platinum alloy (NiPt), Ir, platinum iridium alloy (PtIr), Er, Yb, Pd, Rh, Nb, titanium silicon nitride (TiSiN), other refractory metals, or a combination thereof.

The formation of silicide layers 140A can be followed by the formation of metal contacts 142A. In some embodiments, the formation of metal contacts 142A can include blanket depositing a layer of contact metal and polishing the blanket deposited layer of contact metal. In some embodiments, metal contacts 142A can include a conductive material, such as Ru, Ir, Ni, Os, Rh, Al, Mo, W, Co, Al, and Cu. In some embodiments, metal contacts 142A can include a conductive material with low resistivity. In some embodiments, S/D contacts 105 can include a liner between silicide layers 140A and metal contacts 142A.

The formation of S/D contact 105 can be followed by formation of S/D contact 103 on S/D regions of NFET 102B. The formation of S/D contact 103 can include the formation of openings 756, formation of dielectric barrier 136 in openings 756, and formation of silicide layers 140B and metal contacts 142B, as shown in FIGS. 7A, 7B, 8A, and 8B. The processes of forming S/D contact 103 are similar to the processes of forming S/D contact 105 as described above.

Figure 9B:
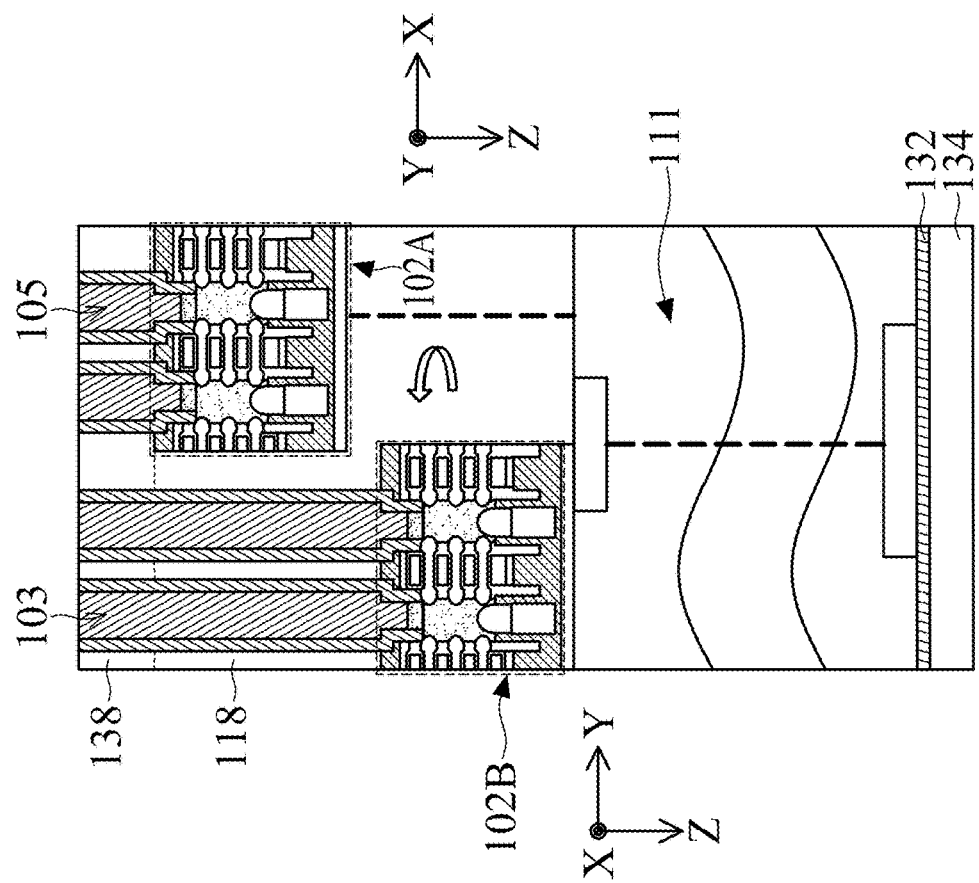
Figure 9A:
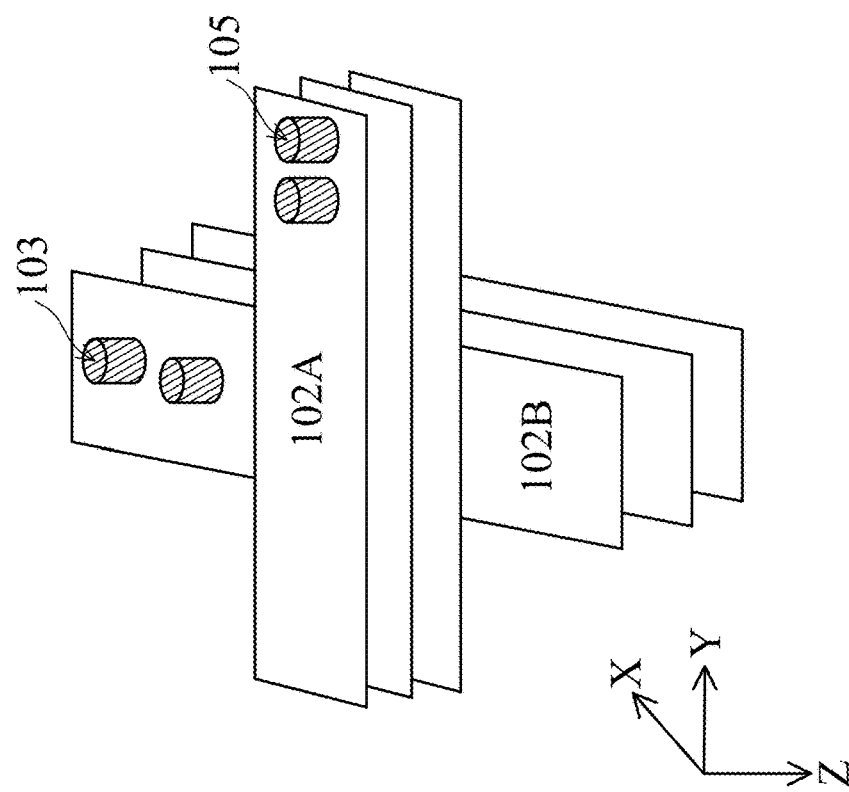

The formation of S/D contacts 103 and 105 can be followed by replacing substrate 106 with dielectric layer 138, as shown in FIGS. 9A and 9B. In some embodiments, the replacement of substrate 106 with dielectric layer 128 can include removing substrate 106 and formation of dielectric layer 128. In some embodiments, substrate 106 can be removed by an etching process. The etching process can include a dry etching process, a wet etching process, or other suitable etching processes to remove substrate 106.

The removal of substrate 106 can be followed by the formation of dielectric layer 138 surrounding S/D contacts 103 and 105. In some embodiments, the formation of dielectric layer 138 can include blanket deposition of dielectric layer 138 and polishing of blank deposited dielectric layer 138. In some embodiments, dielectric layer 138 can include silicon oxide. In some embodiments, replacing substrate 106 with dielectric layer 138 can improve isolation between S/D contacts 103 and 105.

The replacement of substrate 106 with dielectric layer 138 can be followed by the formation of S/D interconnects 113 and 115, as shown in FIGS. 1C and 1D. In some embodiments, S/D interconnect 113 can be connected to a ground Vss (e.g., 0 V). In some embodiments, S/D interconnect 115 can be connected to a power supply line Vdd (e.g., 0.5 V). As shown in FIGS. 1A-1D, and 3-9D, stacked semiconductor devices 100-1 and 100-2, gate contact 101, gate interconnects 111, and gate power supply lines can be formed on first surface 106S1 (e.g., top surface) of substrate 106. S/D contacts 103 and 105, S/D interconnects 113 and 115, and S/D power supply lines can be formed on second surface 106S2 (e.g., bottom surface) of substrate 106. Here, stacked semiconductor devices 100-1 and 100-2 have bottom power rails.

In some embodiments, compared with GAA finFETs without stacked fin structures and bottom power rails, stacked GAA finFETs 102A and 102B with bottom power rails can achieve improved devise performance with reduce parasitic capacitances and resistances, a device area reduction of about 30% to about 50%, and a power consumption reduction of about 30% to about 50%.

Figure 10A:
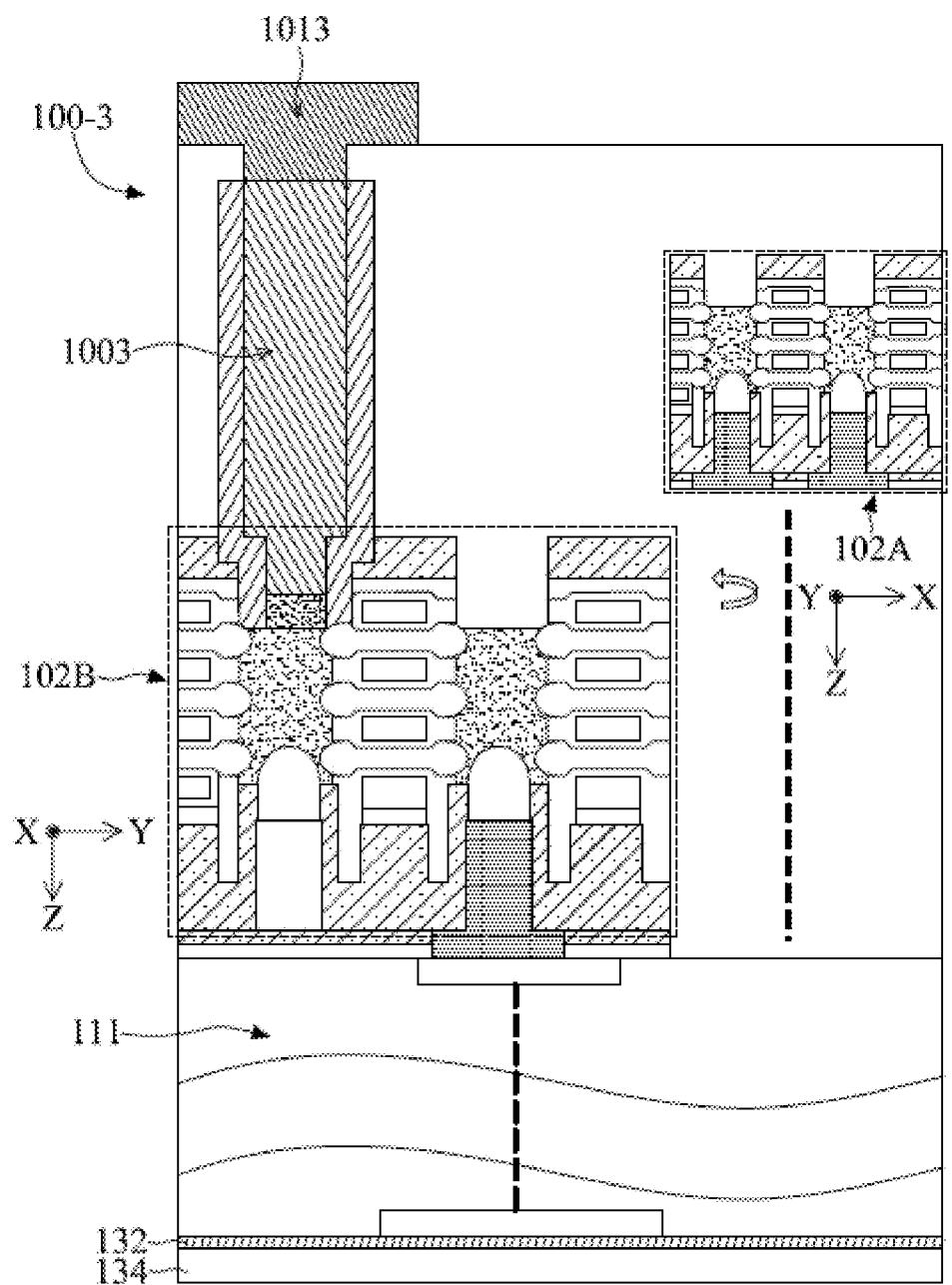
FIGS. 10A and 10B illustrate partial cross-sectional views of crossover-stacked semiconductor devices with various bottom power rails, in accordance with some embodiments.
Figure 10B:
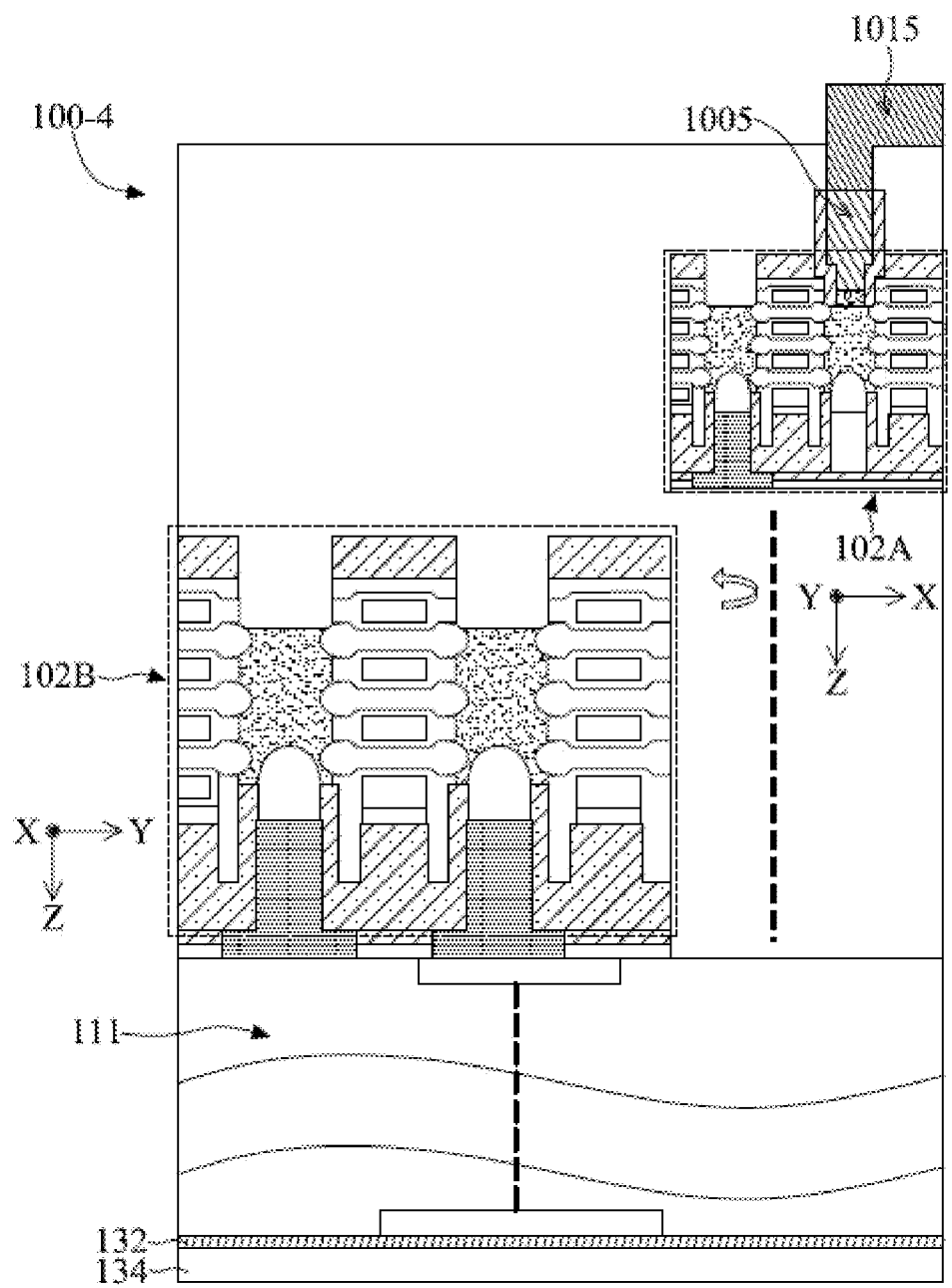

FIGS. 10A and 10B illustrate partial cross-sectional views of crossover-stacked semiconductor devices 100-3 and 100-4 with various bottom power rail configurations, in accordance with some embodiments. Referring to FIG. 10A, a S/D contact 1003 and a S/D interconnect 1013 for NFET 102B can be fabricated on the second surface (e.g., bottom surface) of the substrate, while S/D contacts and interconnects of PFET 102A and gate contact 111 and gate interconnects of PFET 102A and NFET 102B can be fabricated on a first surface (e.g., top surface) of the substrate. Here, crossover-stacked semiconductor device 100-3 has a bottom source contact.

Referring to FIG. 10B, a S/D contact 1005 and a S/D interconnect 1015 for PFET 102A can be fabricated on the second surface (e.g., bottom surface) of the substrate, while S/D contacts and interconnects of NFET 102B and gate contact 111 and gate interconnects of PFET 102A and NFET 102B can be fabricated on a first surface (e.g., top surface) of the substrate. Here, crossover-stacked semiconductor device 100-4 has a bottom drain contact.

Various embodiments in the present disclosure provide methods for forming a stacked semiconductor device (e.g., 100-1, 100-2, 100-3, and 100-4) with bottom power rails. According to some embodiments, stacked semiconductor device 100-1 can include GAA finFET 102B having first fin structure 104B vertically stacked on top of second GAA finFET 102A having second fin structure 104A. In some embodiments, first fin structure 104B and second fin structure 104A can extend along an X-axis (referred to as "vertically stacked"). In some embodiments, first fin structure 104B can extend along a direction (e.g., Y-axis) about 90 degrees related to a direction (e.g., X-axis) of the second fin structure (referred to as "crossover-stacked"). Crossover-stacked GAA finFETs 100-2, 100-3, and 100-4 can reduce parasitic capacitances and parasitic resistances and thus improve device performance.

In some embodiments, first source/drain (S/D) contact 103 of first GAA finFET 102B and second S/D contact 105 of second GAA finFET 102A can be both connected to S/D power supply lines on second surface 106S2 (e.g., bottom surface) of substrate 106 (referred to as "bottom power rails"), opposite to first surface 106S1 (e.g., top surface) of substrate 106 which can include first and second GAA finFETs 102A and 102B and gate contact 101 connected to a gate power supply line. In some embodiments, first S/D contact 103 or second S/D contact 105 can connect to S/D power supply lines on second surface 106S2 (e.g., bottom surface) of substrate 106 (referred to as "bottom power rails"), opposite to first surface 106S1 (e.g., top surface) of substrate 106, which can include first and second GAA finFETs 102A and 102B and gate contact 101 connected to a gate power supply line. In some embodiments, crossover-stacked GAA finFETs with bottom power rails can achieve a device area reduction of about 30% to about 50%. With area reduction and shorter metal interconnects due to bottom power rails, parasitic capacitances and parasitic resistances can be reduced, thus improving device performance. As a result, the voltage drop on the metal interconnects can be reduced by about 30% to about 50%. In some embodiments, cross-over stacked GAA finFETs with bottom power rails can improve overall PPA performance of GAA finFETs.

In some embodiments, a method includes forming a stacked semiconductor device on a first surface of a substrate. The stacked semiconductor device includes a first fin structure, an isolation structure on the first fin structure, and a second fin structure above the first fin structure and in contact with the isolation structure. The first fin structure includes a first source/drain (S/D) region and the second fin structure includes a second S/D region. The method further includes etching a second surface of the substrate and a portion of the first S/D region or the second S/D region to form an opening. The second surface is opposite to the first surface. The method further includes forming a dielectric barrier in the opening and forming an S/D contact in the opening.

In some embodiments, a method includes forming a stacked semiconductor device on a first surface of a substrate. The stacked semiconductor device includes a first fin structure, an isolation structure on the first fin structure, and a second fin structure above the first fin structure and in contact with the isolation layer. The first fin structure includes a first source/drain (S/D) region and the second fin structure includes a second S/D region. The method further includes etching a second surface of the substrate and a portion of the first S/D region to form a first opening. The second surface is opposite to the first surface. The method further includes forming a first dielectric barrier in the first opening, forming a first S/D contact in the first opening, etching the second surface the substrate and a portion of the second S/D region to form a second opening, forming a second dielectric barrier in the second opening, and forming a second S/D contact in the second opening.

In some embodiments, an integrated circuit includes a stacked semiconductor device on a first surface of a substrate. The stacked semiconductor device includes a first fin structure, an isolation structure on the first fin structure and a second fin structure above the first fin structure and in contact with the isolation structure. The first fin structure includes a first source/drain (S/D) region, and the second fin structure includes a second S/D region. The integrated circuit further includes an S/D contact on a second surface of the substrate and connected to the first S/D region or the second S/D region and a dielectric barrier surrounding the S/D contact. The dielectric barrier includes silicon nitride.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a stacked semiconductor device on a first surface of a substrate, wherein the stacked semiconductor device comprises a first device stacked over a second device, and wherein the second device comprises a source/drain (S/D) region;
   a S/D contact structure on a second surface of the substrate and connected to the S/D region, wherein the second surface is opposite to the first surface; and
   a dielectric barrier surrounding the S/D contact structure, wherein the dielectric barrier is in contact with the S/D region, and wherein a thickness of the dielectric barrier ranges from about 3 nm to about 5 nm.

2. The integrated circuit of claim 1, further comprising a gate contact structure on the first surface of the substrate, wherein the gate contact structure is connected to a gate structure of the first device.

3. The integrated circuit of claim 1, further comprising an isolation structure between the first and second devices.

4. The integrated circuit of claim 1, wherein the S/D contact structure comprises a silicide layer on the S/D region and a metal contact structure on the silicide layer.

5. The integrated circuit of claim 1, further comprising a S/D interconnect on the S/D contact structure, wherein the S/D contact structure and the S/D interconnect connect the S/D region to a power supply.

6. The integrated circuit of claim 1, further comprising a S/D interconnect on the S/D contact structure, wherein the S/D contact structure and the S/D interconnect connect the S/D region to ground.

7. The integrated circuit of claim 1, wherein the first device comprises a first stack of semiconductor layers extending along a first direction, and wherein the second device comprises a second stack of semiconductor layers extending along the first direction.

8. The integrated circuit of claim 1, wherein the first device comprises a first stack of semiconductor layers extending along a first direction, and wherein the second device comprises a second stack of semiconductor layers extending along a second direction about 90 degrees relative to the first direction.

9. The integrated circuit of claim 1, further comprising a block structure on the first surface of the substrate, wherein the block structure and the S/D contact structure are on opposite sides of the S/D region.

10. A semiconductor device, comprising:
    first and second stacks of semiconductor layers on a first surface of a substrate, wherein the first stack of semiconductor layers is stacked over the second stack of semiconductor layers;
    an epitaxial layer between the first and second stacks of semiconductor layers;
    a gate structure surrounding the first and second stacks of semiconductor layers;
    a source/drain (S/D) region in contact with the second stack of semiconductor layers and the epitaxial layer; and
    a S/D contact structure on a second surface of the substrate and connected to the S/D region, wherein the second surface is opposite to the first surface.

11. The semiconductor device of claim 10, further comprising a gate contact structure on the first surface of the substrate, wherein the gate contact structure is connected to the gate structure.

12. The semiconductor device of claim 10, further comprising an isolation structure between the first and second stacks of semiconductor layers.

13. The semiconductor device of claim 10, wherein the S/D contact structure comprises a silicide layer on the S/D region and a metal contact structure on the silicide layer.

14. The semiconductor device of claim 10, further comprising a S/D interconnect on the S/D contact structure, wherein the S/D contact structure and the S/D interconnect connect the S/D region to a power supply or ground.

15. The semiconductor device of claim 10, wherein the first and second stacks of semiconductor layers extends along a same direction.

16. The semiconductor device of claim 10, further comprising a block structure on the first surface of the substrate, wherein the block structure and the S/D contact structure are on opposite sides of the S/D region.

17. A semiconductor device, comprising:
    first and second stacks of semiconductor layers on a first surface of a substrate, wherein the first stack of semiconductor layers is stacked over the second stack of semiconductor layers;
    a dielectric structure between the first and second stacks of semiconductor layers;
    an epitaxial layer on the dielectric structure;
    a first source/drain (S/D) region on the epitaxial layer and in contact with the first stack of semiconductor layers;
    a second S/D region in contact with the second stack of semiconductor layers, wherein the dielectric structure is in contact with top surfaces of the second stacks of semiconductor layers and the second S/D region; and
    first and second S/D contact structures on a second surface of the substrate, wherein:
    the second surface is opposite to the first surface;
    the first S/D contact structure is connected to the first S/D region; and
    the second S/D contact structure is connected to the second S/D region.

18. The semiconductor device of claim 17, further comprising a first S/D interconnect on the first S/D contact structure and a second S/D interconnect on the second S/D contact structure, wherein the first S/D contact structure and the first S/D interconnect connect the first S/D region to a power supply, and wherein the second S/D contact structure and the second S/D interconnect connect the second S/D region to ground.

19. The semiconductor device of claim 17, further comprising a gate contact structure on the first surface of the substrate, wherein the gate contact structure is connected to a gate structure surrounding the second stack of semiconductor layers.

20. The semiconductor device of claim 17, further comprising a block structure on the first surface of the substrate, wherein the block structure and the first S/D contact structure are on opposite sides of the first S/D region.

* * * * *